US012598854B2

(12) United States Patent
Kim et al.

(10) Patent No.: US 12,598,854 B2
(45) Date of Patent: Apr. 7, 2026

(54) DISPLAY DEVICE

(71) Applicant: Samsung Display Co., LTD., Yongin-si (KR)

(72) Inventors: Hyung June Kim, Yongin-si (KR); Se Hyung Cho, Yongin-si (KR); Jang Bog Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 473 days.

(21) Appl. No.: 18/116,134

(22) Filed: Mar. 1, 2023

(65) Prior Publication Data

US 2023/0282682 A1    Sep. 7, 2023

(30) Foreign Application Priority Data

Mar. 3, 2022    (KR) ........................ 10-2022-0027617

(51) Int. Cl.
  *H10H 29/14*      (2025.01)
  *H10H 20/821*    (2025.01)
  *H10H 20/84*      (2025.01)
  *H10H 20/856*    (2025.01)

(52) U.S. Cl.
  CPC ........ *H10H 29/142* (2025.01); *H10H 20/821* (2025.01); *H10H 20/84* (2025.01); *H10H 20/856* (2025.01)

(58) Field of Classification Search
  CPC .... H10H 29/142; H10H 20/821; H10H 20/84;
H10H 20/856; H10H 20/841; H10H 20/819; H10H 20/8513; H10H 20/862; H10H 20/8512; H01L 25/0753; H01L 25/167
See application file for complete search history.

(56) References Cited

U.S. PATENT DOCUMENTS

| | | | |
|---|---|---|---|
| 9,064,825 B2 | 6/2015 | Kim | |
| 10,340,480 B1 | 7/2019 | Peckham | |
| 2015/0137081 A1 | 5/2015 | Kim et al. | |
| 2016/0351754 A1* | 12/2016 | Kim .................... H10H 20/841 |

FOREIGN PATENT DOCUMENTS

| | | | |
|---|---|---|---|
| KR | 10-2015-0056375 A | 5/2015 |
| KR | 10-2036326 B1 | 10/2019 |
| KR | 10-2020-0124732 A | 11/2020 |
| KR | 10-2022-0016418 A | 2/2022 |
| KR | 10-2022-0023922 A | 3/2022 |

* cited by examiner

*Primary Examiner* — Mohammad A Rahman
(74) *Attorney, Agent, or Firm* — Womble Bond Dickinson (US) LLP

(57) ABSTRACT
A display device including: an insulating reflective layer on a substrate; and a light emitting element on the insulating reflective layer, wherein the insulating reflective layer includes a first layer and a second layer on the first layer, the first layer includes a first area of a shared layer that is at least a portion of the insulating reflective layer, the second layer includes a second area of the shared layer, the first layer includes a first distributed Bragg reflector configured to reflect light in a first wavelength band, and the second layer includes a second distributed Bragg reflector configured to reflect light in a second wavelength band.

18 Claims, 14 Drawing Sheets

DISPLAY DEVICE

CROSS-REFERENCE TO RELATED APPLICATION

This application claims priority to and the benefit of Korean Patent Application No. 10-2022-0027617 filed in the Korean Intellectual Property Office on Mar. 3, 2022, the entire content of which is incorporated by reference herein.

BACKGROUND

1. Field

The present disclosure relates to a display device.

2. Description of the Related Art

Recently, as interest in an information display is increasing, research and development for display devices are continuously conducted.

SUMMARY

The present disclosure has been made in an effort to provide a display device with improved light output efficiency.

One or more embodiments of the present disclosure provides a display device including: an insulating reflective layer on a substrate; and a light emitting element on the insulating reflective layer, wherein the insulating reflective layer includes a first layer and a second layer on the first layer, the first layer includes a first area of a shared layer that is at least a portion of the insulating reflective layer, the second layer includes a second area of the shared layer, the first layer includes a first distributed Bragg reflector configured to reflect light in a first wavelength band, and the second layer includes a second distributed Bragg reflector configured to reflect light in a second wavelength band.

A first central wavelength of the first wavelength band may be different from a second central wavelength of the second wavelength band.

A difference between the first central wavelength and the second central wavelength may be greater than or equal to 30 nm and less than or equal to 50 nm.

A range of ±10 nm based on the first central wavelength may include 520 nm, and a range of ±10 nm based on the second central wavelength may include 480 nm.

An average wavelength of the insulating reflective layer may be about 500 nm.

The second central wavelength may be smaller than the first central wavelength, and the first layer may be closer to the substrate than the second layer.

The shared layer may include a first shared layer in the first area and a second shared layer in the second area, the first layer may include a (1_1)-th layer, a (1_2)-th layer on the (1_1)-th layer, and the first shared layer on the (1_2)-th layer, and the second layer may include a (2_1)-th layer, and the second shared layer on the (2_1)-th layer.

The (1_1)-th layer and the (1_2)-th layer may form a pair, and the insulating reflective layer includes a plurality of pairs of the layers.

The first shared layer and the second shared layer may include a same material.

The (1_2)-th layer and the first shared layer may form the first distributed Bragg reflector configured to reflect light in the first wavelength band, and the (2_1)-th layer and the second shared layer may form the second distributed Bragg reflector configured to reflect light in the second wavelength band.

The (1_1)-th layer, the first shared layer, and the second shared layer may include a same material.

The (1_2)-th layer and the (2_1)-th layer may include a same material.

The (1_1)-th layer, the first shared layer, and the second shared layer may include a silicon oxide, and the (1_2)-th layer and the (2_1)-th layer may include a silicon nitride.

The (1_1)-th layer, the first shared layer, and the second shared layer may include a silicon nitride, and the (1_2)-th layer and the (2_1)-th layer may include a silicon oxide.

The display device may further include: a first sub-pixel configured to emit light of a first color; a second sub-pixel configured to emit light of a second color; a third sub-pixel configured to emit light of a third color; and a color conversion layer on the light emitting element configured to change a wavelength of light, wherein the insulating reflective layer may be in the first sub-pixel, the second sub-pixel, and the third sub-pixel.

The light emitting element may be in each of the first sub-pixel, the second sub-pixel, and the third sub-pixel and configured to emit light of the third color, and the second wavelength band may include at least a portion of a wavelength band corresponding to the third color.

In a display area in which the first sub-pixel, the second sub-pixel, and the third sub-pixel may be disposed, the number of the second sub-pixels may be larger than that of the first sub-pixels and may be larger than that the third sub-pixels, and the first wavelength band may include at least a portion of a wavelength band corresponding to the second color.

The display device may further include a via layer on the substrate, wherein the via layer may be between the insulating reflective layer and the substrate.

The display device may further include a via layer on the substrate, wherein the insulating reflective layer may be between the substrate and the via layer.

Another embodiment of the disclosure provides a display device including: electrodes on a substrate; an insulating reflective layer on the electrodes; and a light emitting element on the insulating reflective layer, wherein the insulating reflective layer includes a Bragg distributed reflector layer and a low-refractive layer on the Bragg distributed reflector layer, and a refractive index of the low-refractive layer is smaller than a refractive index of a layer of the Bragg distributed reflector layer adjacent to the low-refractive layer.

According to the embodiment of the present disclosure, a display device having improved light output efficiency may be provided.

BRIEF DESCRIPTION OF THE DRAWINGS

The above and other aspects and features of the present disclosure will become more apparent by describing in detail embodiments thereof with reference to the attached drawings, in which:

FIG. 10 illustrates a schematic cross-sectional view of a sub-pixel according to a third embodiment;

FIG. 11 illustrates a schematic cross-sectional view of a sub-pixel according to a fourth embodiment;

DETAILED DESCRIPTION

Because the present disclosure may be variously modified and have various forms, embodiments will be illustrated and described in detail in the following. This, however, by no means restricts the invention to the specific embodiments, and it is to be understood as embracing all included in the spirit and scope of the present disclosure changes, equivalents, and substitutes.

Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present disclosure. Singular forms are intended to include plural forms unless the context clearly indicates otherwise.

In the present disclosure, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In addition, in the present specification, when a portion of a layer, film, region, area, plate, or the like is referred to as being formed "on" another portion, the formed direction is not limited to an upper direction but includes a lateral or lower direction. In contrast, when an element of a layer, film, region, area, plate, or the like is referred to as being "below" another element, it may be directly below the other element, or intervening elements may be present.

The present disclosure relates to a display device. Hereinafter, a display device according to one or more embodiments will be described with reference to the accompanying drawings.

First, a light emitting element LD according to one or more embodiments will be described with reference to FIG. 1 and FIG. 2.

Figure 1:
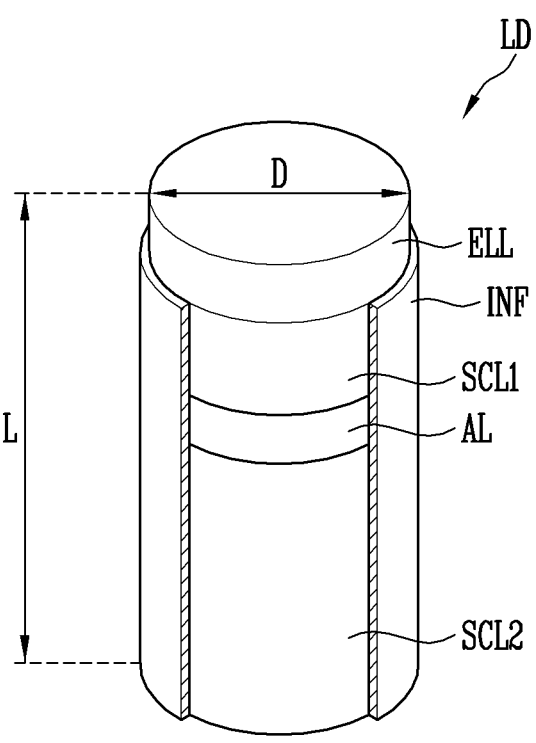
FIG. 1 illustrates a schematic perspective cutaway view of a light emitting element according to one or more embodiments.

FIG. 1 illustrates a schematic perspective view of a light emitting element according to one or more embodiments. FIG. 2 illustrates a schematic cross-sectional view of a light emitting element according to one or more embodiments.

Figure 2:
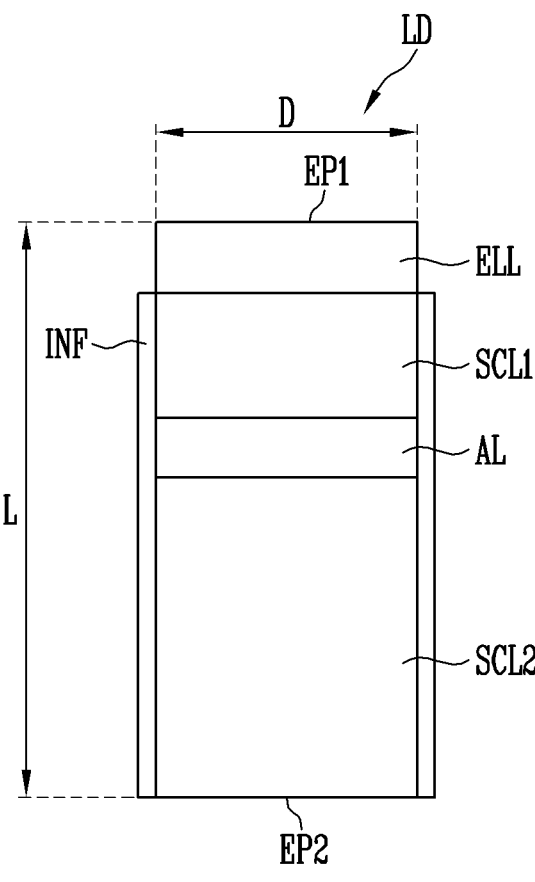
FIG. 2 illustrates a schematic cross-sectional view of a light emitting element according to one or more embodiments.

FIG. 1 and FIG. 2 illustrate a cylindrical shape light emitting element LD, but a type and/or shape of the light emitting element LD is not limited thereto.

The light emitting element LD may include a second semiconductor layer SCL2, a first semiconductor layer SCL1, and an active layer AL interposed between the first and second semiconductor layers SCL1 and SCL2. For example, when an extending direction of the light emitting element LD is referred to as a length L direction, the light emitting element LD may include the first semiconductor layer SCL1, the active layer AL, and the second semiconductor layer SCL2 sequentially stacked along the length L direction. The light emitting element LD may further include an electrode layer ELL and an insulating film INF.

The light emitting element LD may be provided to have a cylindrical shape extending along one direction. The light emitting element LD may have a first end portion EP1 and a second end portion EP2. The first semiconductor layer SCL1 may be adjacent to the first end portion EP1 of the light emitting element LD, and the second semiconductor layer SCL2 may be adjacent to the second end portion EP2 of the light emitting element LD. The electrode layer ELL may be adjacent to the first end portion EP1.

The light emitting element LD may be a light emitting element manufactured in a cylindrical shape through an etching method or the like. In the present specification, the "cylindrical shape" includes a rod-like shape or bar-like shape (that is, with an aspect ratio greater than 1) that is long in the length L direction, such as a circular cylinder or a polygonal cylinder, but a shape of a cross-section thereof is not particularly limited. For example, the length L of the light emitting element LD may be larger than a diameter D thereof (or a width of a lateral cross-section thereof).

The light emitting element LD may have a size of a nano-scale to a micro-scale. For example, the light emitting element LD may each have the diameter D (or width) and/or the length L ranging from a nano scale to a micro scale. However, the size of the light emitting element LD is not limited thereto.

The first semiconductor layer SCL1 may be a first conductive semiconductor layer. The first semiconductor layer SCL1 is disposed to on the active layer AL, and may include a semiconductor layer of a type different from that of the second semiconductor layer SCL2. For example, the first semiconductor layer SCL1 may include a P-type semiconductor layer. For example, the first semiconductor layer SCL1 may include at least one semiconductor material of InAlGaN, GaN, AlGaN, InGaN, AlN, and InN, and may include a P-type semiconductor layer doped with a first conductive dopant such as Mg. However, the material included in the first semiconductor layer SCL1 is not limited thereto, and the first semiconductor layer SCL1 may be made of various materials.

The active layer AL may be disposed between the first semiconductor layer SCL1 and the second semiconductor layer SCL2, and may have a single-quantum or multiquantum well structure. The position of the active layer AL is not limited to a specific example, and may be variously changed according to a type of the light emitting element LD.

A clad layer doped with a conductive dopant may be formed at an upper portion and/or a lower portion of the active layer AL. For example, the clad layer may be formed as an AlGaN layer or an InAlGaN layer. In one or more embodiments, a material such as AlGaN and InAlGaN may be used to form the active layer AL, and in addition, various materials may form the active layer AL.

The second semiconductor layer SCL2 may be a second conductive semiconductor layer. The second semiconductor layer SCL2 is disposed on the active layer AL, and may include a semiconductor layer of a type different from that of the first semiconductor layer SCL1. For example, the second semiconductor layer SCL2 may include an N-type semiconductor layer. For example, the second semiconductor layer SCL2 may include a semiconductor material of one of InAlGaN, GaN, AlGaN, InGaN, AlN, and InN, and may include a N-type semiconductor layer doped with a second conductive dopant such as Si, Ge, Sn, or the like. However, the material included in the second semiconductor layer SCL2 is not limited thereto, and the second semiconductor layer SCL2 may be made of various materials.

When a voltage of a threshold voltage or more is applied to respective ends of the light emitting element LD, the light emitting device LD emits light while electron-hole pairs are combined in the active layer AL. By controlling the light emitting of the light emitting element LD by using this principle, the light emitting element LD may be used as a light source for various light emitting devices in addition to pixels of a display device.

The insulating film INF may be disposed on a surface of the light emitting element LD. The insulating film INF may be formed on the surface of the light emitting device LD so as to be around (e.g., surround) at least an outer surface (e.g., an outer peripheral or circumferential surface) of the active layer AL, and may further be around (e.g., surround) one area of the first and second semiconductor layers SCL1 and SCL2. The insulating film INF may be formed as a single film or a double film, but is not limited thereto, and may be formed as a plurality of films. For example, the insulating film INF may include a first insulating film including a first material and a second insulating film including a second material different from the first material.

The insulating film INF may expose respective end portions of the light emitting element LD having different polarities. For example, the insulating film INF may expose one end of each of the electrode layer ELL and the second semiconductor layer SCL2 adjacent to the first and second end portions EP1 and EP2 of the light emitting element LD.

The insulating film INF may be configured as a single layer or multilayer including one insulating material of a silicon oxide (SiOx), a silicon nitride (SiNx), a silicon oxynitride (SiOxNy), an aluminum oxide (AlOx), and a titanium oxide (TiOx). However, the present disclosure is not necessarily limited to the example described above. For example, according to one or more embodiments, the insulating film INF may be omitted.

According to one or more embodiments, when the insulating film INF is provided to cover the surface (e.g., the outer surface) of the light emitting element LD, particularly the outer peripheral or circumferential surface of the active layer AL, electrical stability of the light emitting element LD may be secured. In addition, when the insulating film INF is provided on the surface of the light emitting element LD, it is possible to improve life-span and efficiency thereof by reducing or minimizing surface defects of the light emitting element LD. In addition, it is possible to prevent an unwanted short circuit between the light emitting elements LD from occurring even when a plurality of light emitting elements LD are disposed in close contact with each other.

The electrode layer ELL may be disposed on the first semiconductor layer SCL1. The electrode layer ELL may be adjacent to the first end portion EP1. The electrode layer ELL may be electrically connected to the first semiconductor layer SCL1.

A portion of the electrode layer ELL may be exposed. For example, the insulating film INF may expose one surface of the electrode layer ELL. The electrode layer ELL may be exposed in an area corresponding to the first end portion EP1.

In one or more embodiments, a side surface of the electrode layer ELL may be exposed. For example, the insulating film INF may cover a side surface of each of the first semiconductor layer SCL1, the active layer AL, and the second semiconductor layer SCL2, while may not cover at least a portion of a side surface of the electrode layer ELL. In this case, electrical connection to another component of the electrode layer ELL adjacent to the first end portion EP1 may be easy. In one or more embodiments, the insulating film INF may expose a portion of the side surface of the first semiconductor layer SCL1 and/or the second semiconductor layer SCL2 as well as the side surface of the electrode layer ELL.

According to one or more embodiments, the electrode layer ELL may be an ohmic contact electrode. However, the present disclosure is not necessarily limited to the example described above. For example, the electrode layer ELL may be a Schottky contact electrode.

According to one or more embodiments, the electrode layer ELL may include one of chromium (Cr), titanium (Ti), aluminum (Al), gold (Au), nickel (Ni), and an oxide or alloy thereof. However, the present disclosure is not necessarily limited to the example described above. In one or more embodiments, the electrode layer ELL may be substantially transparent. For example, the electrode layer ELL may include an indium tin oxide (ITO). Accordingly, light emitted may pass through the electrode layer ELL.

The structure and shape of the light emitting element LD are not limited to the above-described example, and the light emitting element LD may have various structures and shapes according to one or more embodiments. For example, the light emitting element LD may further include an additional electrode layer that is disposed on one surface of the second semiconductor layer SCL2 and is adjacent to the second end portion EP2.

Figure 3:
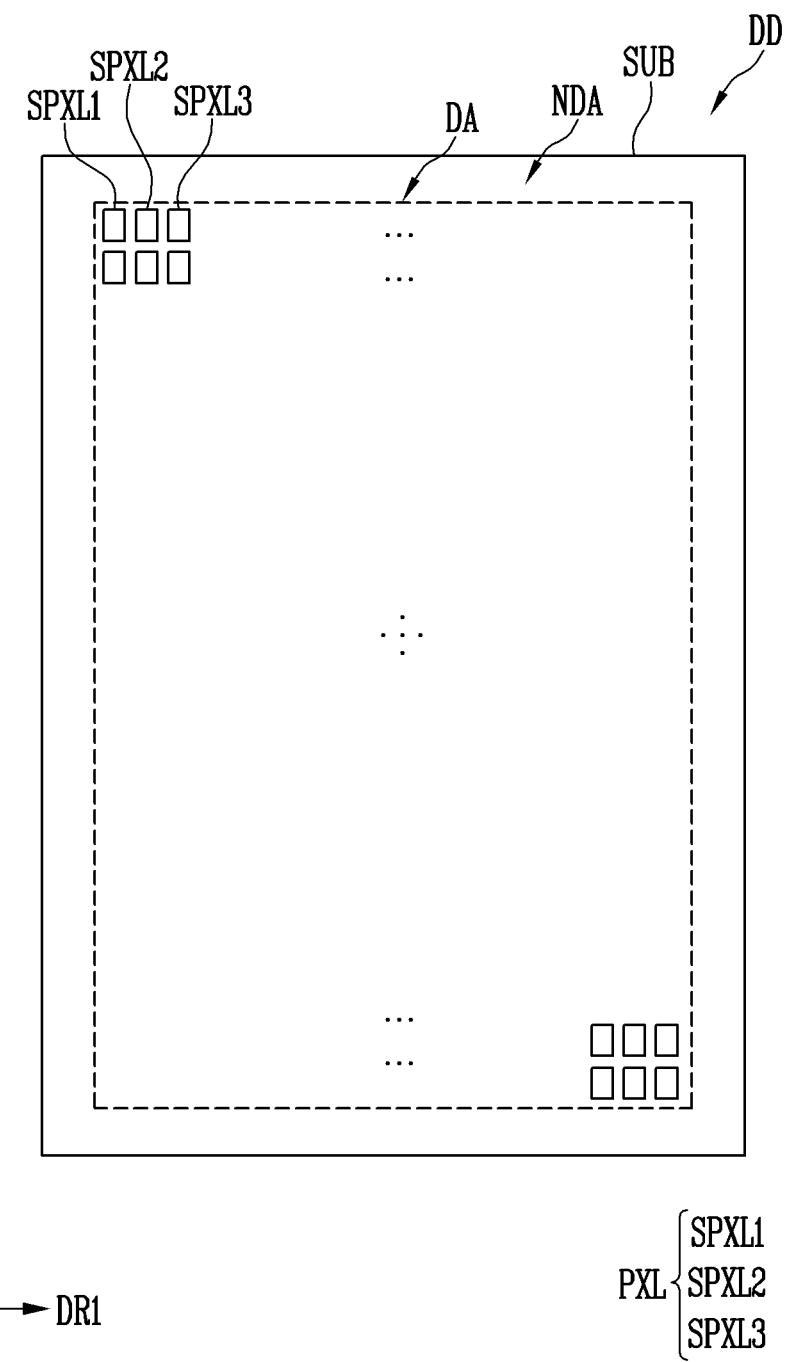
FIG. 3 illustrates a schematic top plan view of a display device according to one or more embodiments.

FIG. 3 illustrates a schematic top plan view of a display device according to one or more embodiments.

A display device DD is configured to emit light. Referring to FIG. 3, the display device DD may include a substrate SUB and a pixel PXL disposed on the substrate SUB. In one or more embodiments, the display device DD may further include a driving circuit part (for example, a scan driver and a data driver) for driving the pixel PXL, wires, and pads.

The display device DD may include a display area DA and a non-display area NDA around (e.g., surrounding) an edge or periphery of the display area DA. The non-display area NDA may refer to an area other than the display area DA. The non-display area NDA may be around (e.g., surround) at least a portion of the display area DA.

The substrate SUB may configure a base member of the display device DD. The substrate SUB may be a rigid or flexible substrate or film. For example, the substrate SUB may be a hard substrate made of glass or tempered glass, a flexible substrate (or a thin film) made of a plastic or metallic material, or at least one layered insulating layer. The material and/or physical properties of the substrate SUB are not particularly limited. In one or more embodiments, the substrate SUB may be substantially transparent. Here, the "substantially transparent" may mean that light may be transmitted at a suitable transmittance (e.g., a predetermined transmittance) or more. In one or more embodiments, the substrate SUB may be translucent or opaque. In addition, the substrate SUB may include a reflective material according to one or more embodiments.

The display area DA may refer to an area in which the pixel PXL is disposed. The non-display area NDA may refer to an area in which the pixel PXL is not disposed. In the non-display area NDA, the driving circuit part, wires, and pads connected to the pixel PXL of the display area DA may be disposed.

According to one or more embodiments, the pixels PXL may be arranged according to a stripe or a PENTILE® arrangement structure, but the present disclosure is not limited thereto, and various examples may be applied to the present disclosure. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

According to one or more embodiments, the pixel PXL may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. At least one of the first sub-pixel SPXL1, the second sub-pixel SPXL2, and the third sub-pixel SPXL3 may configure one pixel unit capable of emitting light of various colors.

For example, each of the first sub-pixel SPXL1, the second sub-pixel SPXL2, and the third sub-pixel SPXL3 may emit light of a desired color (e.g., a predetermined color). For example, the first sub-pixel SPXL1 may be a red sub-pixel emitting red (for example, a first color) light, and the second sub-pixel SPXL2 may be a green sub-pixel emitting green (for example, a second color) light, and the third sub-pixel SPXL3 may be a blue sub-pixel emitting blue (for example, a third color) light. In one or more embodiments, the number of the second sub-pixels SPXL2 may be greater than the number of the first sub-pixels SPXL1 and the number of the third sub-pixels SPXL3. However, the color, type, and/or number of the first sub-pixel SPXL1, the second sub-pixel SPXL2, and the third sub-pixel SPXL3 configuring each pixel unit described above are not limited to a specific example.

Hereinafter, a pixel PXL (or a sub-pixel SPXL) according to one or more embodiment will be described with reference to FIG. 4 to FIG. 13.

FIG. 4 to FIG. 13 illustrate the pixel PXL (or sub-pixel SPXL) according to one or more embodiments.

Figure 4:
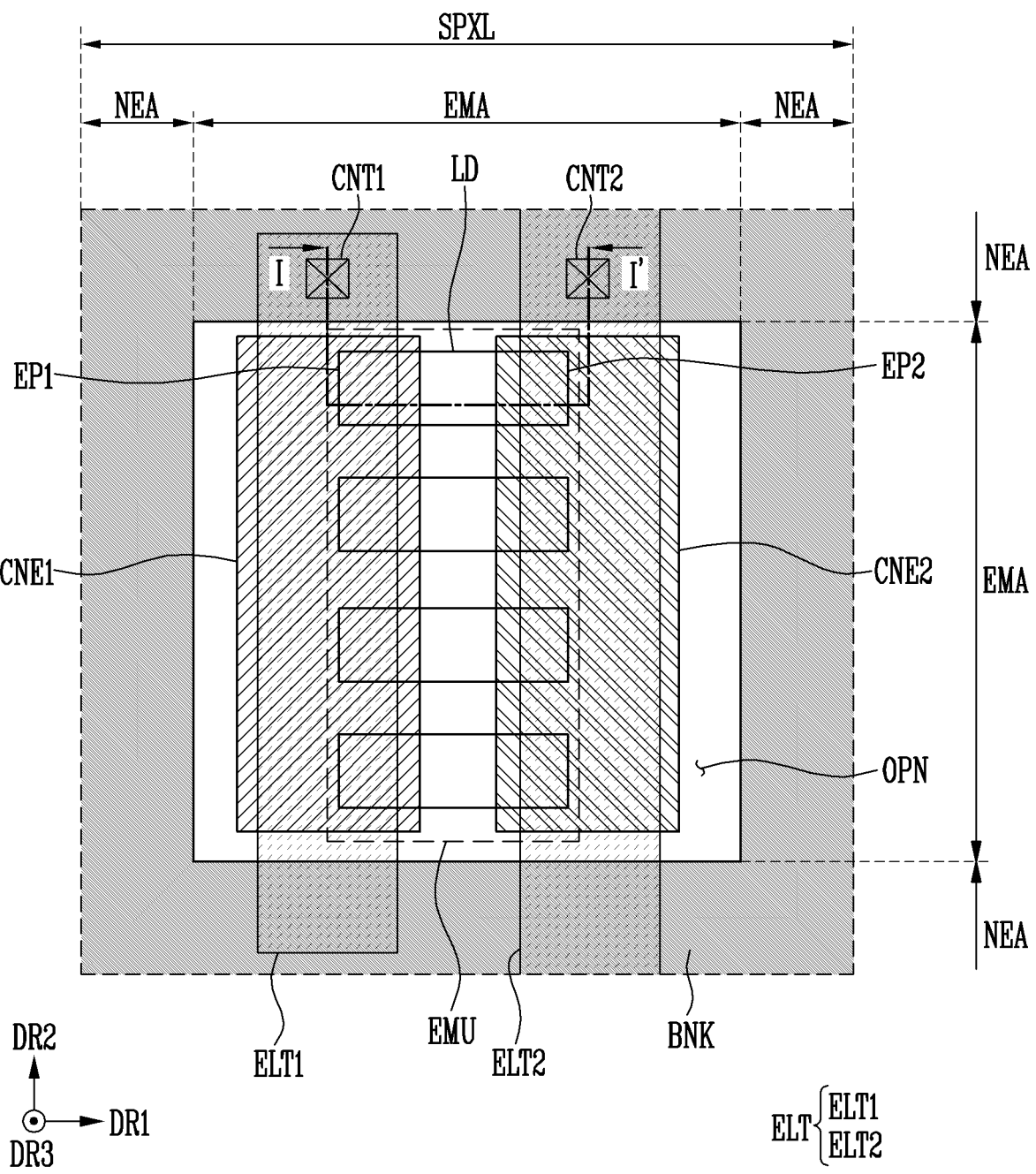
FIG. 4 illustrates a schematic top plan view of a sub-pixel according to one or more embodiments.

First, a planar structure of the sub-pixel SPXL will be mainly described with reference to FIG. 4. FIG. 4 illustrates a schematic top plan view of a sub-pixel according to one or more embodiments. The sub-pixel SPXL shown in FIG. 4 may be one of the first to third sub-pixels SPXL1, SPXL2, and SPXL3 described with reference to FIG. 3.

The sub-pixel SPXL may include a light emitting area EMA and a non-light emitting area NEA. The sub-pixel SPXL may include a bank BNK, an alignment electrode ELT (e.g., ELT1, ELT2), a light emitting element LD, a first contact electrode CNE1, and a second contact electrode CNE2.

The light emitting area EMA may overlap an opening OPN defined by the bank BNK in a plan view. The light emitting elements LD may be disposed in the light emitting area EMA.

The light emitting elements LD may not be disposed in the non-light emitting area NEA. A portion of the non-light emitting area NEA may overlap the bank BNK in a plan view.

The bank BNK may form (or provide) an opening OPN. For example, the bank BNK may have a shape protruding in a thickness direction (for example, a third direction DR3) of the substrate SUB, and may have a shape surrounding an area (e.g., a predetermined area). Accordingly, the opening OPN in which the bank BNK is not disposed may be formed.

The bank BNK may form a space. The bank BNK may have a shape surrounding a partial area in a plan view. The space may refer to an area in which a fluid may be accommodated. According to one or more embodiments, the bank BNK may include a first bank (see 'BNK1' in FIG. 5) and a second bank (see 'BNK2' in FIG. 5).

According to one or more embodiments, ink including the light emitting element LD is provided in a space defined by the bank BNK (for example, the first bank BNK1), so that the light emitting element LD may be disposed in the opening OPN.

According to one or more embodiments, a color conversion layer (see 'CCL' in FIG. 12) may be disposed (or patterned) in a space defined by the bank BNK (for example, the second bank BNK2).

The bank BNK may define the light emitting area EMA and the non-light emitting area NEA. The bank BNK may surround at least a portion of the light emitting area EMA in a plan view. For example, an area in which the bank BNK is disposed may be the non-light emitting area NEA. As an area in which the bank BNK is not disposed, an area in which the light emitting element LD is disposed may be the light emitting area EMA.

The alignment electrode ELT may be an electrode for aligning the light emitting element LD. In one or more embodiments, the alignment electrode ELT may include a first electrode ELT1 and a second electrode ELT2. The alignment electrode ELT may be referred to as an "electrode" or "electrodes".

The alignment electrode ELT may be configured of a single layer or a multilayer. For example, the alignment electrode ELT includes at least one reflective electrode layer including a reflective conductive material, and may optionally further include at least one transparent electrode layer and/or a conductive capping layer. In one or more embodiments, the alignment electrode ELT may include one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the present disclosure is not limited to the above example, and the alignment electrode ELT may include one of various materials having a reflective characteristic. However, the present disclosure is not limited to the example described above.

The light emitting element LD may be disposed on the alignment electrode ELT. In one or more embodiments, at least a portion of the light emitting element LD may be disposed between the first electrode ELT1 and the second electrode ELT2. The light emitting element LD may be aligned between the first electrode ELT1 and the second electrode ELT2. The light emitting elements LD may form (or configure) a light emitting unit EMU. The light emitting unit EMU may refer to a unit including light emitting elements LD adjacent to each other.

In one or more embodiments, the light emitting element LD may be arranged in various ways. For example, FIG. 4 illustrates the embodiment in which the light emitting elements LD are arranged in parallel between the first electrode ELT1 and the second electrode ELT2. However, the present disclosure is not necessarily limited to the example described above. For example, the light emitting elements LD may be arranged in a series structure or a mixed series/parallel structure, and the number of units connected in series and/or parallel is not particularly limited.

The first electrode ELT1 and the second electrode ELT2 may be spaced from each other. For example, the first electrode ELT1 and the second electrode ELT2 may be spaced from each other in a first direction DR1 in the light emitting area EMA, and may respectively extend along a second direction DR2.

According to one or more embodiments, the first electrode ELT1 and the second electrode ELT2 are electrodes for aligning the light emitting element LD, and the first electrode ELT1 may be a first alignment electrode, and the second electrode ELT2 may be a second alignment electrode.

The first electrode ELT1 and the second electrode ELT2 may be supplied (or provided) with a first alignment signal and a second alignment signal, respectively, in a process step in which the light emitting elements LD are aligned. For example, ink including the light emitting element LD may be supplied (or provided) to the opening OPN defined by the bank BNK (for example, the first bank BNK1), and the first alignment signal may be supplied to the first electrode ELT1, and the second alignment signal may be supplied to the second electrode ELT2. In this case, the first alignment signal and the second alignment signal may have different waveforms, potentials, and/or phases. For example, the first alignment signal may be an AC signal, and the second alignment signal may be a ground signal. However, the present disclosure is not necessarily limited to the example described above. Accordingly, an electric field is formed between (or on) the first electrode ELT1 and the second electrode ELT2, so that the light emitting elements LD may be aligned between the first electrode ELT1 and the second electrode ELT2 based on the electric field. For example, the light emitting elements LD may be moved (or rotated) by force (for example, dielectrophoresis (DEP) force) according to the electric field between the first electrode ELT1 and the second electrode ELT2 of the alignment electrode ELT to align the light emitting elements LD.

The first electrode ELT1 may be electrically connected to a circuit element (for example, a transistor (see 'TR' in FIG. 5)) through a first contact portion CNT1. In one or more embodiments, the first electrode ELT1 may provide an anode signal for the light emitting element LD to emit light. The first electrode ELT1 may provide the first alignment signal for aligning the light emitting element LD.

The second electrode ELT2 may be electrically connected to a power wire (see 'PL' in FIG. 5) through a second contact portion CNT2. In one or more embodiments, the second electrode ELT2 may provide a cathode signal for the light emitting element LD to emit light. The second electrode ELT2 may provide the second alignment signal for aligning the light emitting element LD.

The positions of the first contact portion CNT1 and the second contact portion CNT2 are not limited to the positions shown in FIG. 4, and may be appropriately and variously changed.

The light emitting element LD may emit light based on an electrical signal supplied to the light emitting element LD. For example, the light emitting element LD may provide light based on a first electrical signal (for example, an anode signal) provided from the first contact electrode CNE1 and a second electrical signal (for example, a cathode signal) provided from the second contact electrode CNE2.

The first end portion EP1 of the light emitting element LD may be disposed to be adjacent to the first electrode ELT1, and the second end portion EP2 of the light emitting element LD may be disposed to be adjacent to the second electrode ELT2. The first end portion EP1 may or may not overlap the first electrode ELT1. The second end portion EP2 may or may not overlap the second electrode ELT2.

In one or more embodiments, the first end portion EP1 of each of the light emitting elements LD may be electrically connected to the first electrode ELT1 through the first contact electrode CNE1. In one or more embodiments, the first end portion EP1 of each of the light emitting elements LD may be directly connected to the first electrode ELT1. In one or more embodiments, the first end portion EP1 of each of the light emitting elements LD may be electrically connected only to the first contact electrode CNE1 and not to the first electrode ELT1.

Similarly, the second end portion EP2 of each of the light emitting elements LD may be electrically connected to the second electrode ELT2 through the second contact electrode CNE2. In one or more embodiments, the second end portion EP2 of each of the light emitting elements LD may be directly connected to the second electrode ELT2. In one or more embodiments, the second end portion EP2 of each of the light emitting elements LD may be electrically connected only to the second contact electrode CNE2 and not to the second electrode ELT2.

The first contact electrode CNE1 and the second contact electrode CNE2 may be disposed on the first end portions EP1 and second end portions EP2 of the light emitting elements LD, respectively.

The first contact electrode CNE1 may be disposed on the first end portions EP1 to be electrically connected to the first end portions EP1 of the light emitting elements LD. In one or more embodiments, the first contact electrode CNE1 may be disposed on the first electrode ELT1 to be electrically connected to the first electrode ELT1. In this case, the first end portions EP1 of the light emitting elements LD may be connected to the first electrode ELT1 through the first contact electrode CNE1.

The second contact electrode CNE2 may be disposed on the second end portions EP2 to be electrically connected to the second end portions EP2 of the light emitting elements LD. In one or more embodiments, the second contact electrode CNE2 may be disposed on the second electrode ELT2 to be electrically connected to the second electrode ELT2. In this case, the second end portions EP2 of the light emitting elements LD may be connected to the second electrode ELT2 through the second contact electrode CNE2.

Hereinafter, a cross-sectional structure of the pixel PXL (or the sub-pixel SPXL) will be mainly described with reference to FIG. 5 to FIG. 7 and FIG. 9 to FIG. 14, and a reflectance according to a light wavelength of an insulating reflective layer 100 included in the pixel PXL (or the sub-pixel SPXL) according to one or more embodiments will be described with reference to FIG. 8. Contents that may be redundant to the above-described contents are to be simplified or not to be duplicated.

First, a pixel circuit layer PCL and a display element layer DPL of the sub-pixel SPXL according to one or more embodiments will be described with reference to FIG. 5, and the insulating reflective layer 100 according to one or more embodiments will be described with reference to FIG. 6 to FIG. 11. Particularly, a reflectance according to a light wavelength of the insulating reflective layer 100 will be described with reference to FIG. 8. In addition, a color conversion layer CCL, an optical layer OPL, a color filter layer CFL, and an outer film layer OFL of the pixel PXL according to one or more embodiments will be described with reference to FIG. 12, and they will be described in conjunction with the display element layer DPL and the color conversion layer CCL according to one or more embodiments with reference to FIG. 13.

Figure 5:
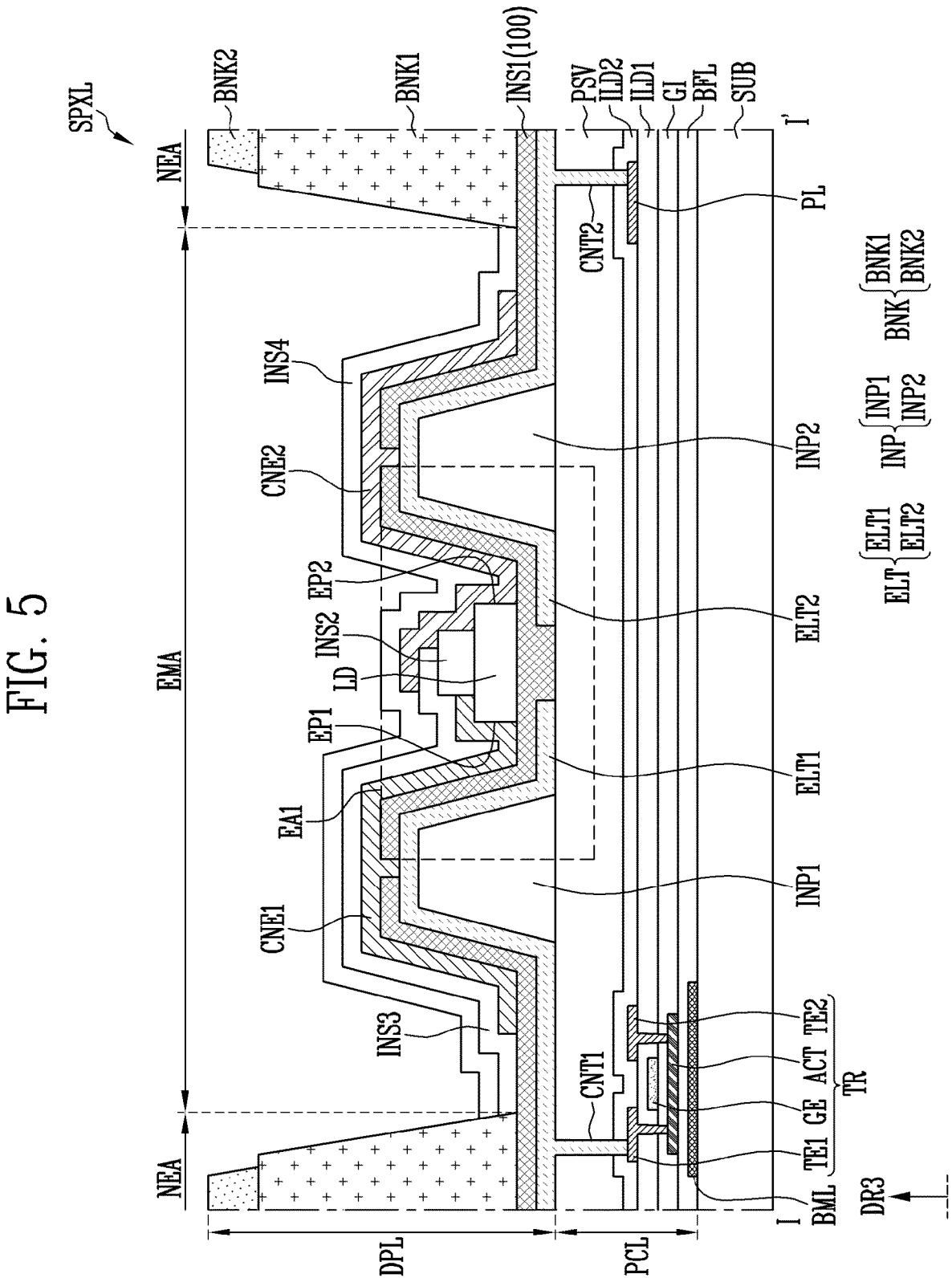
FIG. 5 illustrates a schematic cross-sectional view of a sub-pixel according to a first embodiments.
Figure 6:
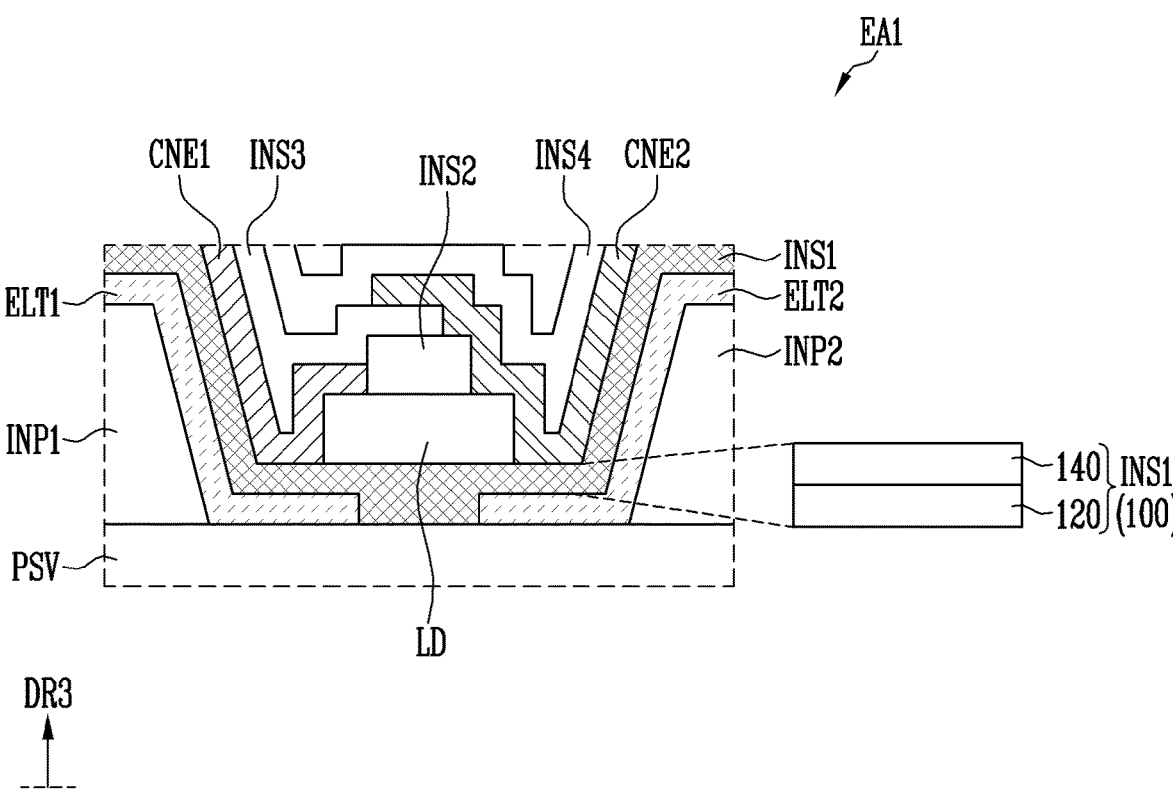
FIG. 6 illustrates a schematic enlarged view of an area EA1 of FIG. 5, and illustrates a schematic cross-sectional view of a structure according to the first embodiment.
Figure 7:
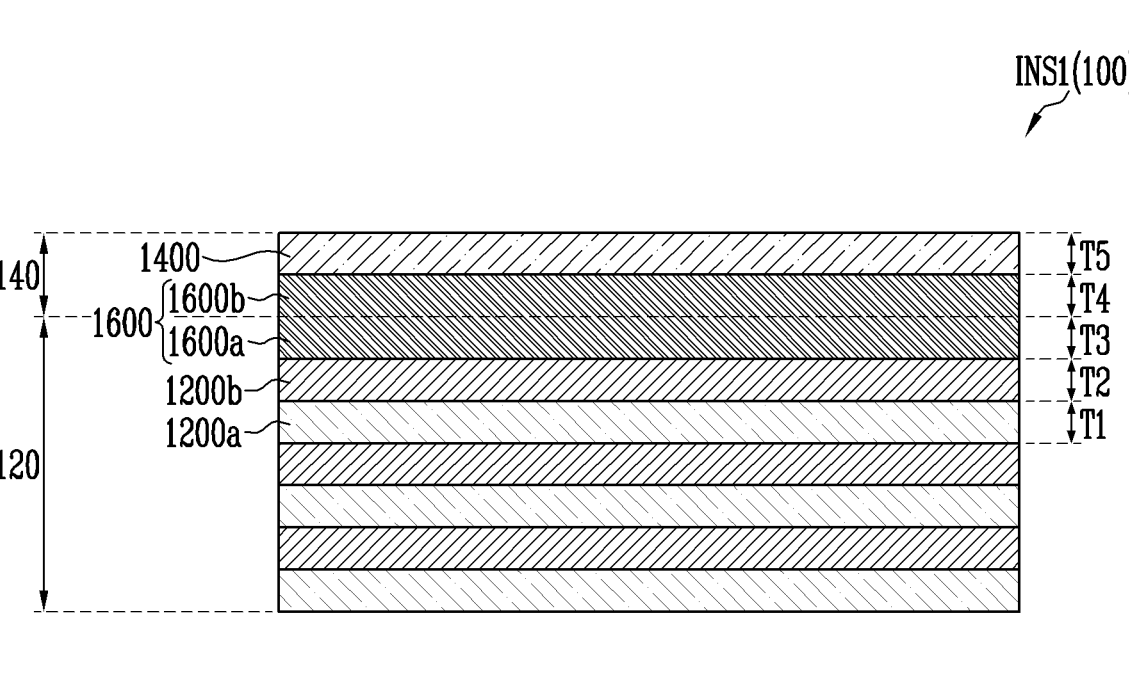
FIG. 7 illustrates a schematic cross-sectional view of an insulating reflective layer according to one or more embodiments.
Figure 7:
Figure 9:
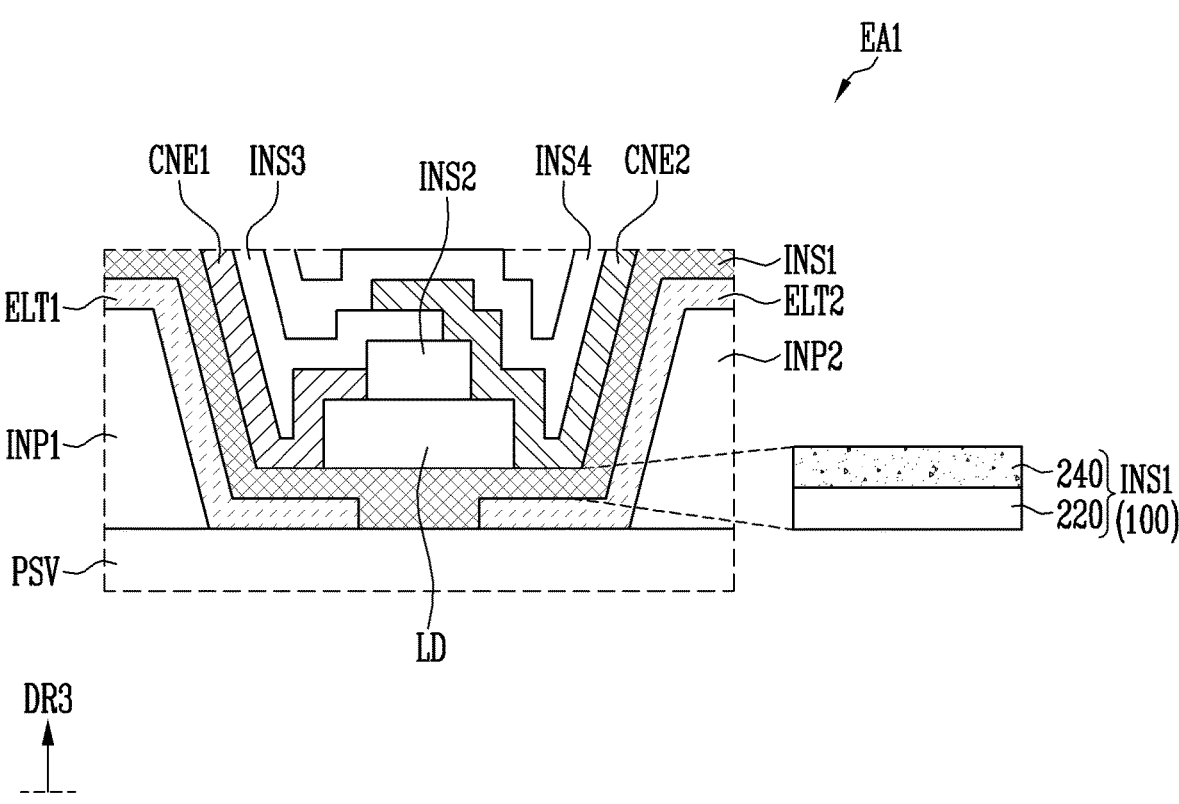
FIG. 9 illustrates a schematic enlarged view of the area EA1 of FIG. 5, and illustrates a schematic cross-sectional view of a structure according to a second embodiment.
Figure 10:
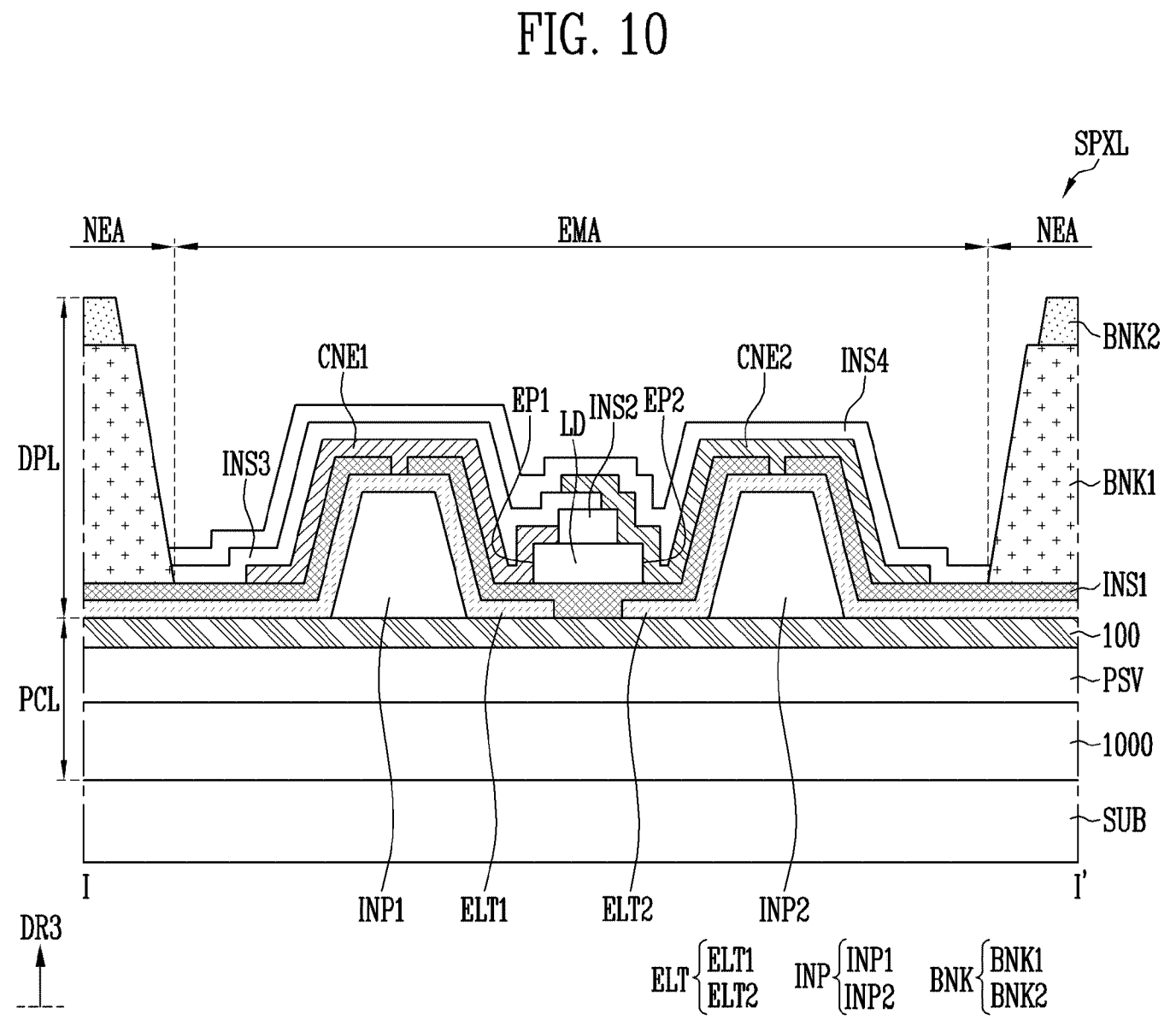
Figure 11:
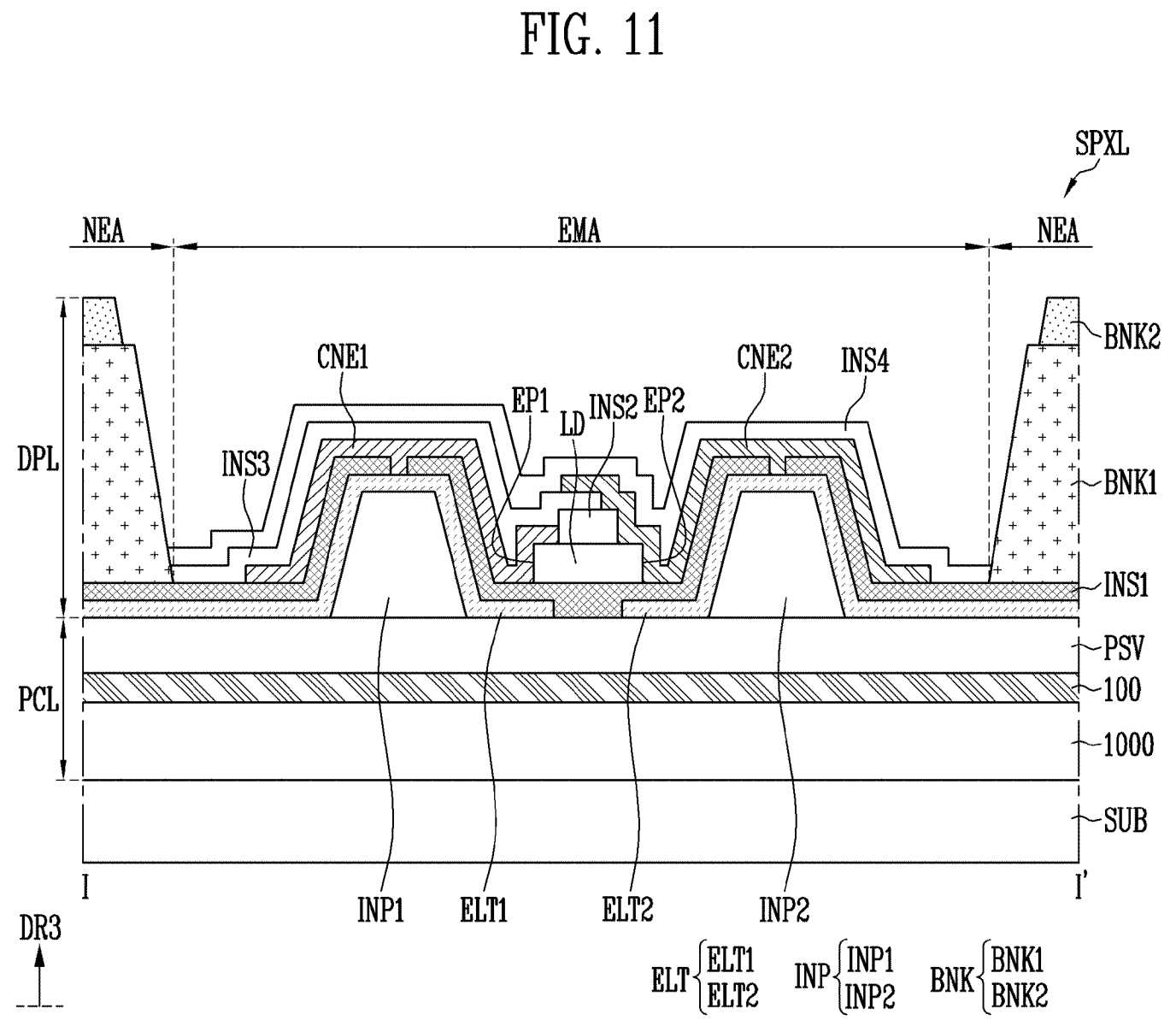

In this case, FIG. 5 to FIG. 7 may be cross-sectional views of a sub-pixel SPXL according to a first embodiment. FIG. 9 may be a cross-section view of a sub-pixel SPXL according to a second embodiment. FIG. 10 may be a cross-sectional view of a sub-pixel SPXL according to a third embodiment. FIG. 11 may be a cross-sectional view of a sub-pixel SPXL according to a fourth embodiment.

FIG. 5 illustrates a schematic cross-sectional view of a sub-pixel according to the first embodiment.

Referring to FIG. 5, the sub-pixel SPXL may include the substrate SUB, the pixel circuit layer PCL, and the display element layer DPL.

The substrate SUB may form (or configure) the base member of the sub-pixel SPXL. The substrate SUB may provide an area in which the pixel circuit layer PCL and the display element layer DPL may be disposed.

The pixel circuit layer PCL may be disposed on the substrate SUB. The pixel circuit layer PCL may include a bottom auxiliary electrode BML, a buffer film BFL, a transistor TR, a gate insulating film GI, a first interlayer insulating film ILD1, a second interlayer insulating film ILD2, and a passivation film PSV.

The bottom auxiliary electrode BML may be disposed on the substrate SUB. The bottom auxiliary electrode BML may function as a path through which an electrical signal is transmitted. In one or more embodiments, a portion of the bottom auxiliary electrode BML may overlap the transistor TR in a plan view (i.e., may overlap the transistor TR in the third direction DR3).

The buffer film BFL may be disposed on the substrate SUB. The buffer film BFL may cover the bottom auxiliary electrode BML. The buffer film BFL may prevent impurities from being diffused from the outside. The buffer film BFL may include one of a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

The transistor TR may be a thin film transistor (TFT). According to one or more embodiments, the transistor TR may be a driving transistor. The transistor TR may be electrically connected to the light emitting element LD. The transistor TR may be electrically connected to the first end portion EP1 of the light emitting element LD.

The transistor TR may include an active layer ACT, a first transistor electrode TE1, a second transistor electrode TE2, and a gate electrode GE.

The active layer ACT may be a semiconductor layer. The active layer ACT may be disposed on the buffer film BFL. The active layer ACT may include one of a polysilicon, a low temperature polycrystalline silicon (LTPS), an amorphous silicon, and an oxide semiconductor.

The active layer ACT may include a first contact area contacting the first transistor electrode TE1 and a second contact area contacting the second transistor electrode TE2. The first contact area and the second contact area may be a semiconductor pattern doped with an impurity. An area between the first contact area and the second contact area may be a channel area. The channel area may be an intrinsic semiconductor pattern in which no impurity is doped.

The gate electrode GE may be disposed on the gate insulating film GI. The position of the gate electrode GE may correspond to the position of the channel area of the active layer ACT. For example, the gate electrode GE may be disposed on the channel area of the active layer ACT with the gate insulating film GI interposed therebetween.

The gate insulating film GI may be disposed on the buffer film BFL. The gate insulating film GI may cover the active layer ACT. The gate insulating film GI may include one of a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

The first interlayer insulating film ILD1 may be disposed on the gate insulating film GI. The first interlayer insulating film ILD1 may cover the gate electrode GE. The first interlayer insulating film ILD1 may include one of a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

The first transistor electrode TE1 and the second transistor electrode TE2 may be disposed on the first interlayer insulating film ILD1. The first transistor electrode TE1 may pass through the gate insulating film GI and the first interlayer insulating film ILD1 to contact the first contact area of the active layer ACT, and the second transistor electrode TE2 may pass through the gate insulating film GI and the first interlayer insulating film ILD1 to contact the second contact area of the active layer ACT. For example, the first transistor electrode TE1 may be a drain electrode, and the second transistor electrode TE2 may be a source electrode, but are not limited thereto.

The first transistor electrode TE1 may be electrically connected to the first electrode ELT1 through the first contact portion CNT1 passing through the passivation film PSV and the second interlayer insulating film ILD2.

The power wire PL may be disposed on the first interlayer insulating film ILD1. In one or more embodiments, the power wire PL may be disposed at the same layer as the first transistor electrode TE1 and the second transistor electrode TE2. The power wire PL may be electrically connected to the second electrode ELT2 through the second contact portion CNT2. The power wire PL may supply a power source or an alignment signal through the second electrode ELT2.

The second interlayer insulating film ILD2 may be disposed on the first interlayer insulating film ILD1. The second interlayer insulating film ILD2 may cover the first transistor electrode TE1, the second transistor electrode TE2, and the power wire PL. The second interlayer insulating film ILD2 may include one of a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

The passivation film PSV may be disposed on the second interlayer insulating film ILD2. In one or more embodiments, the passivation film PSV may be a via layer. The passivation film PSV may include an organic material to flatten a lower step. For example, the passivation film PSV may include an organic material such as an acrylates resin, an epoxy resin, a phenolic resin, a polyamides resin, a polyimide resin, a polyesters resin, a polyphenylenesulfides resin, or a benzocyclobutene (BCB). However, it is not necessarily limited thereto, and the passivation film PSV may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

According to one or more embodiments, the sub-pixel SPXL may include the first contact portion CNT1 and the second contact portion CNT2. The first contact portion CNT1 and the second contact portion CNT2 may pass through the second interlayer insulating film ILD2 and the passivation film PSV. The first electrode ELT1 and the first transistor electrode TE1 may be electrically connected to each other through the first contact portion CNT1. The second electrode ELT2 and the power wire PL may be electrically connected to each other through the second contact portion CNT2.

The display element layer DPL may be disposed on the pixel circuit layer PCL. The display element layer DPL may include the insulating reflective layer 100 (for example, a first insulating film INS1), an insulating pattern INP, the alignment electrode ELT, the bank BNK, the light emitting element LD, a second insulating film INS2, the first contact electrode CNE1, a third insulating film INS3, the second contact electrode CNE2, and a fourth insulating film INS4.

The insulating pattern INP may be disposed on the passivation film PSV. The insulating pattern INP may have various shapes according to one or more embodiments. In one or more embodiments, the insulating pattern INP may protrude in the thickness direction (for example, the third direction DR3) of the substrate SUB. In addition, the insulating pattern INP may be formed to have an inclined surface inclined at a suitable angle (e.g., a predetermined angle) with respect to the substrate SUB. However, the present disclosure is not necessarily limited thereto, and the insulating pattern INP may have a side wall such as a curved surface or a step shape. For example, the insulating pattern INP may have a cross-section of a semicircle or semi-ellipse shape.

The insulating pattern INP may serve to form a step (e.g., a predetermined step) so that the light emitting elements LD may be easily aligned in the light emitting area. In one or more embodiments, the insulating pattern INP may be a partition wall.

According to one or more embodiments, a portion of the alignment electrode ELT may be disposed on the insulating pattern INP. For example, the insulating pattern INP may include a first insulating pattern INP1 and a second insulating pattern INP2. The first electrode ELT1 may be disposed on the first insulating pattern INP1, and the second electrode ELT2 may be disposed on the second insulating pattern INP2, and accordingly, a reflective wall may be formed on the insulating pattern INP. Accordingly, light emitted from the light emitting element LD is recycled, so that the light output efficiency of the display device DD (or the pixel PXL) may be improved.

The insulating pattern INP may include at least one organic material and/or inorganic material. For example, the insulating pattern INP may include an organic material such as an acrylates resin, an epoxy resin, a phenolic resin, a polyamides resin, a polyimide resin, a polyesters resin, a polyphenylenesulfides resin, or a benzocyclobutene (BCB). However, it is not necessarily limited thereto, and the insulating pattern INP may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The alignment electrode ELT may be disposed on the passivation film PSV and/or the insulating pattern INP. As described above, a portion of the alignment electrode ELT may be disposed on the insulating pattern INP to form a reflective wall. An alignment signal (for example, an AC signal and a ground signal) for aligning the light emitting element LD may be supplied to the alignment electrode ELT, and in one or more embodiments, an electrical signal (for example, an anode signal and a cathode signal) for the light emitting element LD to emit light may be supplied to the alignment electrode ELT.

In one or more embodiments, the alignment electrode ELT may be disposed on a back surface of the insulating reflective layer 100. For example, the alignment electrode ELT may be disposed between the insulating pattern INP or the passivation film PSV and the insulating reflective layer 100. For example, one surface of the alignment electrode ELT may be in contact with the insulating reflective layer 100.

The first electrode ELT1 may be electrically connected to the light emitting element LD. The first electrode ELT1 may be electrically connected to the first contact electrode CNE1 through a contact hole formed in the first insulating film INS1. The first electrode ELT1 may provide an anode signal for the light emitting element LD to emit light.

The second electrode ELT2 may be electrically connected to the light emitting element LD. The second electrode ELT2 may be electrically connected to the second contact electrode CNE2 through a contact hole formed in the first insulating film INS1. The second electrode ELT2 may provide a cathode signal (for example, a ground signal) for the light emitting element LD to emit light.

According to one or more embodiments, one surface of each of the first electrode ELT1 and the second electrode ELT2 may be in contact with the insulating reflective layer 100 (for example, a rear surface of the insulating reflective layer 100).

The insulating reflective layer 100 may be on the alignment electrode ELT. For example, the insulating reflective layer 100 may cover the first electrode ELT1 and the second electrode ELT2. A portion of the rear surface of the insulating reflective layer 100 may be in contact with the alignment electrode ELT. The insulating reflective layer 100 may be the first insulating film INS1.

According to one or more embodiments, the insulating reflective layer 100 may be configured to reflect light by including a plurality of layers. In addition, the insulating reflective layer 100 may stabilize connection between electrode components and reduce external influences. In one or more embodiments, the insulating reflective layer 100 may be a distributed Bragg reflector (DBR). For example, the insulating reflective layer 100 may include a plurality of layers having different refractive indexes to reflect light provided from the light emitting element LD. Accordingly, the light output efficiency of the display device DD (or the pixel PXL) may be improved. A detailed cross-sectional structure of the insulating reflective layer 100 will be described later with reference to FIG. 6.

The bank BNK may be disposed on the insulating reflective layer 100. In one or more embodiments, the bank BNK may include a first bank BNK1 and a second bank BNK2.

The first bank BNK1 may be disposed on the insulating reflective layer 100. In one or more embodiments, the first bank BNK1 may not overlap the light emitting area EMA and may overlap the non-light emitting area NEA in a plan view. As described above, the first bank BNK1 may protrude in the thickness direction (for example, the third direction DR3) of the substrate (SUB) to define the opening OPN, and in the process of supplying the light emitting elements LD, a space in which the light emitting elements LD may be provided may be formed in the opening OPN.

The first bank BNK1 may include an organic material such as an acrylates resin, an epoxy resin, a phenolic resin, a polyamides resin, a polyimide resin, a polyesters resin, a polyphenylenesulfides resin, or a benzocyclobutene (BCB). However, it is not necessarily limited thereto, and the first bank BNK1 may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The second bank BNK2 may be on the first bank BNK1. The second bank BNK2 may protrude in the thickness direction (for example, the third direction DR3) of the substrate SUB to define the opening OPN, and a space in which the color conversion layer CCL is provided may be formed in the opening OPN.

The second bank BNK2 may include an organic material such as an acrylates resin, an epoxy resin, a phenolic resin, a polyamides resin, a polyimide resin, a polyesters resin, a polyphenylenesulfides resin, or a benzocyclobutene (BCB). However, it is not necessarily limited thereto, and the second bank BNK2 may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The light emitting element LD may be disposed on the insulating reflective layer 100. In one or more embodiments, the light emitting element LD may emit light based on an electrical signal (for example, an anode signal and a cathode signal) provided from the first contact electrode CNE1 and the second contact electrode CNE2.

The light emitting element LD may be disposed in an area surrounded by the first bank BNK1. The light emitting element LD may be disposed between the first insulating pattern INP1 and the second insulating pattern INP2.

The second insulating film INS2 may be disposed on the light emitting element LD. The second insulating film INS2 may cover the active layer AL of the light emitting element LD.

The second insulating film INS2 may expose at least a portion of the light emitting element LD. For example, the second insulating film INS2 may not cover the first end portion EP1 and the second end portion EP2 of the light emitting element LD, and accordingly, the first end portion EP1 and the second end portion EP2 of the light emitting element LD may be exposed and may be electrically connected to the first contact electrode CNE1 and the second contact electrode CNE2, respectively.

When the second insulating film INS2 is formed on the light emitting elements LD after the alignment of the light emitting elements LD is completed, it is possible to prevent the light emitting elements LD from deviating from an aligned position.

The second insulating film INS2 may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials. However, the present disclosure is not limited to the example described above.

The first contact electrode CNE1 and the second contact electrode CNE2 may be disposed on the insulating reflective layer 100. The first contact electrode CNE1 may be electrically connected to the first end portion EP1 of the light emitting element LD. The second contact electrode CNE2 may be electrically connected to the second end portion EP2 of the light emitting element LD.

The first contact electrode CNE1 may be electrically connected to the first electrode ELT1 through a contact hole passing through the insulating reflective layer 100, and the second contact electrode CNE2 may be electrically connected to the second electrode ELT2 through a contact hole passing through the insulating reflective layer 100.

The first contact electrode CNE1 and the second contact electrode CNE2 may include a conductive material. For example, the first contact electrode CNE1 and the second contact electrode CNE2 may include a transparent conductive material including one of an indium tin oxide (ITO), an indium zinc oxide (IZO), and an indium tin zinc oxide (ITZO). Accordingly, the light emitted from the light emitting elements LD may pass through the first and second contact electrodes CNE1 and CNE2 to be emitted to the outside of the display device DD. However, the present disclosure is not necessarily limited to the example described above.

In one or more embodiments, after one of the first contact electrode CNE1 and the second contact electrode CNE2 is patterned, the other thereof may be patterned. However, the present disclosure is not necessarily limited to the above example, and the first contact electrode CNE1 and the second contact electrode CNE2 may be patterned at the same time point in the same process.

The third insulating film INS3 may be disposed on the insulating reflective layer 100 and the first contact electrode CNE1. At least a portion of the third insulating film INS3 may be disposed between the first contact electrode CNE1 and the second contact electrode CNE2, thereby preventing a short circuit defect between the first contact electrode CNE1 and the second contact electrode CNE2.

The fourth insulating film INS4 may be disposed on the third insulating film INS3 and the second contact electrode CNE2. The fourth insulating film INS4 may protect components of the display element layer DPL from external influences.

The third insulating film INS3 and the fourth insulating film INS4 may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

Hereinafter, a detailed structure of the insulating reflective layer 100 will be described with reference to FIG. 6 and FIG. 7. FIG. 6 illustrates a schematic enlarged view of an area EA1 of FIG. 5, and illustrates a schematic cross-sectional view of a structure according to the first embodiment. FIG. 7 illustrates a schematic cross-sectional view of an insulating reflective layer according to one or more embodiments.

Referring to FIG. 6, the insulating reflective layer 100 (for example, the first insulating film INS1) may include a plurality of layers.

The insulating reflective layer 100 may include a first layer 120 and a second layer 140. The second layer 140 may be disposed on one surface of the first layer 120. The first layer 120 and the second layer 140 may be adjacent to each other.

The first layer 120 may be disposed on the alignment electrode ELT. For example, the first layer 120 may be disposed adjacent to the first electrode ELT1 and the second electrode ELT2. In one or more embodiments, one surface of the first layer 120 may be in contact with the first electrode ELT1.

The second layer 140 may be disposed on rear surfaces of the first contact electrode CNE1 and the second contact electrode CNE2. For example, the second layer 140 may be disposed adjacent to the rear surfaces of the first contact electrode CNE1 and the second contact electrode CNE2. In one or more embodiments, one surface of the second layer 140 may be in contact with the first contact electrode CNE1 and the second contact electrode CNE2.

According to one or more embodiments, the first layer 120 may be more adjacent to the substrate SUB (or the passivation film PSV) than the second layer 140. The second layer 140 may be more adjacent to the color conversion layer CCL (or the first contact electrode CNE1 and the second contact electrode CNE2) than the first layer 120.

According to one or more embodiments, the first layer 120 may include a plurality of layers having different refractive indexes. The plurality of layers forming the first layer 120 may include inorganic materials having different refractive indexes, respectively. In one or more embodiments, each of the plurality of layers forming the first layer 120 may include one of a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

According to one or more embodiments, the second layer 140 may include a plurality of layers having different refractive indexes. The plurality of layers forming the second layer 140 may include inorganic materials having different refractive indexes, respectively. In one or more embodiments, each of the plurality of layers forming the second layer 140 may include one of a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

According to one or more embodiments, each of the first layer 120 and the second layer 140 may be a distributed Bragg reflector configured to reflect light of a desired wavelength band (e.g., a predetermined wavelength band). For example, the first layer 120 may be a first distributed Bragg reflector for reflecting light in a first wavelength band. The second layer 140 may be a second distributed Bragg reflector for reflecting light of a second wavelength band. Here, a first central wavelength of the first wavelength band and a second central wavelength of the second wavelength band may be different from each other. That is, in one or more embodiments, the center wavelengths of the first wavelength band and the second wavelength band may be different from each other, and some wavelength bands thereof may overlap. Here, the central wavelength may be a wavelength band having a highest reflectance in each of the first layer 120 and the second layer 140. In one or more embodiments, the central wavelength is not defined as a single numerical value, but may be defined as suitable numerical range (e.g., a predetermined numerical range). For example, when the central wavelength is defined as having a first wavelength, it may be interpreted as having the first wavelength within a suitable range (e.g., predetermined range, for example, ±10 nm) based on the wavelength value having the highest reflectance.

The first wavelength band may be a wavelength band corresponding to green light. The second wavelength band may be a wavelength band corresponding to blue light. For example, the first central wavelength of the first wavelength band may be about 520 nm. The second central wavelength of the second wavelength band may be about 480 nm. For example, a range of ±10 nm with respect to the first central wavelength may include 520 nm, and a range of ±10 nm with respect to the second central wavelength may include 480 nm. However, the present disclosure is not necessarily limited to the example described above.

According to one or more embodiments, a difference between the first central wavelength of the first wavelength band and the second central wavelength of the second wavelength band may be 30 nm or more and 50 nm or less. Alternatively, in one or more embodiments, a difference between the first central wavelength of the first wavelength band and the second central wavelength of the second wavelength band may be 35 nm or more and 45 nm or less. When the difference between the first central wavelength of the first wavelength band and the second central wavelength of the second wavelength band satisfies the aforementioned numerical range, peak regions of the central wavelengths are prevented from being excessively separated from each other, so that a reflectance change of the insulating reflective layer 100 according to a wavelength may be formed to be flat.

Referring to FIG. 7, each of the first layer 120 and the second layer 140 may include at least a portion of a shared layer 1600.

The first layer 120 may include a (1_1)-th layer 1200a, a (1_2)-th layer 1200b, and a first shared layer 1600a. The (1_1)-th layer 1200a and the (1_2)-th layer 1200b of the first layer 120 are alternately disposed, and the first shared layer 1600a that is a portion of the shared layer 1600 may be disposed on the (1_2)-th layer 1200b closest to the second layer 140. That is, the (1_1)-th layer 1200a and the (1_2)-th layer 1200b may form one pair, and a plurality of pairs formed by the (1_1)-th layer 1200a and the (1_2)-th layer 1200b may be provided in the first layer 120. In one or more embodiments, the (1_2)-th layer 1200b and the first shared layer 1600a may form one pair.

The first shared layer 1600a may be formed on the (1_2)-th layer 1200b adjacent to the second layer 140. In one or more embodiments, the first shared layer 1600a may be a portion of the first layer 120 as one area of the shared layer 1600. The first shared layer 1600a may be referred to as a first area of the shared layer 1600 or a layer disposed in the first area.

The first shared layer 1600a may include the same material as the (1_1)-th layer 1200a, but may include a different material from the (1_2)-th layer 1200b. For example, the first shared layer 1600a and the (1_1)-th layer 1200a may include a silicon oxide (SiOx), and the (1_2)-th layer 1200b may include a silicon nitride (SiNx). Alternatively, the first shared layer 1600a and the (1_1)-th layer 1200a may include a silicon nitride (SiNx), and the (1_2)-th layer 1200b may include a silicon oxide (SiOx). However, the present disclosure is not limited to the example described above.

As an embodiment, in FIG. 7, three pairs formed by the (1_1)-th layer 1200a and the (1_2)-th layer 1200b are mainly illustrated. However, the present disclosure is not limited to the above example, and the number of pairs formed by the (1_1)-th layer 1200a and the (1_2)-th layer 1200b may be appropriately changed. In one or more embodiments, the number of layers of the first layer 120 may be an odd number, so that any one layer may not form a pair.

According to one or more embodiments, while the (1_1)-th layer 1200a and the (1_2)-th layer 1200b form a pair for forming a distributed Bragg reflector, and concurrently (e.g., simultaneously), the (1_2)-th layer 1200b and the first shared layer 1600a may also form a pair for forming a distributed Bragg reflector. Accordingly, reflection efficiency of the first layer 120 may be further improved.

A thickness of each layer forming the first layer 120 may be determined such that the first layer 120 forms the first distributed Bragg reflector that reflects light in the first wavelength band including the first central wavelength.

For example, in order for the first layer 120 to reflect the light of the first wavelength band having the central wavelength of about 520 nm, the (1_1)-th layer 1200a may have a first thickness T1, the (1_2)-th layer 1200b may have a second thickness T2, and the first shared layer 1600a may have a third thickness T3.

The first thickness T1, the second thickness T2, and the third thickness T3 may be substantially determined depending on a wavelength band of light to be reflected by the first layer 120 and a type of a material included in the layer forming the first layer 120. In one or more embodiments, a thickness of the layer forming the first layer 120 may be determined by a wavelength band of light to be reflected by the first layer 120 and a refractive index of each of the layers forming the first layer 120. In one or more embodiments, the thickness of the layers forming the first layer 120 may be determined by $f_0/4n$. Here, $f_0$ is a central wavelength of light to be reflected, and n may be a refractive index of the layers forming the first layer 120 (for example, the (1_1)-th layer 1200a, the (1_2)-th layer 1200b, and the first shared layer 1600a).

For example, in order for the first layer 120 to reflect light with a central wavelength of about 520 nm, when the (1_1)-th layer 1200a and the first shared layer 1600a include a silicon oxide (SiOx) and the (1_2)-th layer 1200b includes a silicon nitride (SiNx), the first thickness T1 may be 780 Å to 860 Å, the second thickness T2 may be 605 Å to 670 Å, and the third thickness T3 may be 780 Å to 860 Å. In one or more embodiments, the first thickness T1 may be about 820 Å, the second thickness T2 may be about 640 Å, and the third thickness T3 may be about 820 Å. However, the present disclosure is not necessarily limited to the example described above.

The second layer 140 may include a (2_1)-th layer 1400 and a second shared layer 1600b. The second layer 140 may have a structure in which the (2_1)-th layer 1400 and the second shared layer 1600b are alternately disposed. That is, the (2_1)-th layer 1400 and the second shared layer 1600b may form one pair.

The second shared layer 1600b may be formed on the (2_1)-th layer 1400. In one or more embodiments, the second shared layer 1600b may be a portion of the second layer 140 as an area of the shared layer 1600. The second shared layer 1600b may be referred to as a second area of the shared layer 1600 or a layer disposed in the second area.

The second shared layer 1600b may include a material different from that of the (2_1)-th layer 1400. For example, the second shared layer 1600b may include a silicon oxide (SiOx), and the (2_1)-th layer 1400 may include a silicon nitride (SiNx). Alternatively, the second shared layer 1600b may include a silicon nitride (SiNx), and the (2_1)-th layer 1400 may include a silicon oxide (SiOx). However, the present disclosure is not necessarily limited to the example described above.

According to one or more embodiments, the second shared layer 1600b may include the same material as the (1_1)-th layer 1200a, but may include a different material from the (1_2)-th layer 1200b. In one or more embodiments, the (2_1)-th layer 1400 may include the same material as the (1_2)-th layer 1200b.

On the other hand, because the first shared layer 1600a and the second shared layer 1600b may be a portion of the shared layer 1600, respectively, the first shared layer 1600a and the second shared layer 1600b include the same material.

FIG. 7 mainly illustrates that the second layer 140 includes a single pair. However, the present disclosure is not limited to the above example, and the second layer 140 may further include a plurality of pairs for forming a distributed Bragg reflector.

According to one or more embodiments, a pair for forming a distributed Bragg reflector may be formed with the (2_1)-th layer 1400 and the second shared layer 1600b that is a portion of the shared layer 1600. In this case, the second layer 140 may not be required to have an excessive thickness while improving the light output efficiency of the display device DD (or the pixel PXL).

A thickness of each layer forming the second layer 140 may be determined such that the second layer 140 forms the second distributed Bragg reflector that reflects light in the second wavelength band including the second central wavelength.

For example, in order for the second layer 140 to reflect light in the second wavelength band having a central wavelength of about 480 nm, the second shared layer 1600b may have a fourth thickness T4, and the (2_1)-th layer 1400 may have a fifth thickness T5.

The fourth thickness T4 and fifth thickness T5 may be substantially determined depending on a wavelength band of light to be reflected by the second layer 140 and a type of a material included in the layer forming the second layer 140. In one or more embodiments, a thickness of the layer forming the second layer 140 may be determined by a wavelength band of light to be reflected by the second layer 140 and a refractive index of each of the layers forming the second layer 140. In one or more embodiments, the thickness of the layers forming the second layer 140 may be determined by $f_0/4n$. Here, $f_0$ is a central wavelength of light to be reflected, and n may be a refractive index of the layers forming the second layer 140 (for example, the second shared layer 1600b and the (2_1)-th layer 1400).

For example, in order for the second layer 140 to reflect light having a central wavelength of about 480 nm, when the (2_1)-th layer 1400 includes a silicon nitride (SiNx) and the second shared layer 1600b includes a silicon oxide (SiOx), the fourth thickness T4 may be about 750 Å and the fifth thickness T5 may be about 590 Å. However, the present disclosure is not necessarily limited to the example described above.

According to one or more embodiments, as described above, the insulating reflective layer 100 may include a plurality of layers configured to respectively reflect light of a plurality of wavelength bands having different central wavelengths. Accordingly, the insulating reflective layer 100 may be configured to reflect light of a wide wavelength band.

For example, the insulating reflective layer 100 may be entirely disposed in the sub-pixels SPXL. That is, a portion of the insulating reflective layer 100 may overlap the first sub-pixel SPXL1 for emitting the light of the first color, another portion of the insulating reflective layer 100 may overlap the second sub-pixel SPXL2 for emitting the light of the second color, and the other portion of the insulating reflective layer 100 may overlap the third sub-pixel SPXL3 for emitting the light of the third color. Experimentally, the insulating reflective layer 100 is not limited to being configured to simply reflect light of one color, and may be configured to reflect light of a wide wavelength band. According to one or more embodiments, the insulating reflective layer 100 includes the first layer 120 configured to reflect the light of the first wavelength band and the second layer 140 configured to reflect the light of the second wavelength band, so that it is possible to reflect light of a wide wavelength band. Accordingly, the light output efficiency of the display device DD (or the pixel PXL) may be improved.

According to one or more embodiments, while the light emitting elements LD may emit the light of the third color (for example, blue), the wavelength of the emitted third color light may be changed by the color conversion layer CCL, so that the sub-pixels SPXL may each provide different colored lights. In this case, in order to improve the light output efficiency of the display device DD (or the pixel PXL), it is required to recycle the light emitted from the color conversion layer CCL while recycling the light of the wavelength band emitted from the light emitting element LD. According to one or more embodiments, the first wavelength band configured to be reflected by the first layer 120 of the insulating reflective layer 100 may correspond to the wavelength band of the second color, and the second wavelength band configured to be reflected by the second layer 140 of the insulating reflective layer 100 may correspond to the wavelength band of the third color. For example, the second color may be green. According to one or more embodiments, in order to implement a full-color image, the number of the second sub-pixels SPXL2 for emitting green light may be larger than that of the first sub-pixels SPXL1 and the third sub-pixels SPXL3. That is, the insulating reflective layer 100 may not only recycle the light emitted from the light emitting element LD, may but also recycle the light of the second color (for example, green light) emitted by the second sub-pixels SPXL2 included at a high ratio, and accordingly, the light output efficiency of the display device DD (or the pixel PXL) may be further improved.

On the other hand, according to one or more embodiments, the first layer 120 and the second layer 140 are included in the same insulating reflective layer 100, so that it is possible to prevent the wavelength band in which light is reflected from being randomly dispersed. This will be described with reference to FIG. 8. FIG. 8 illustrates a graph of reflectance of an insulating reflective layer according to one or more embodiments.

Figure 8:
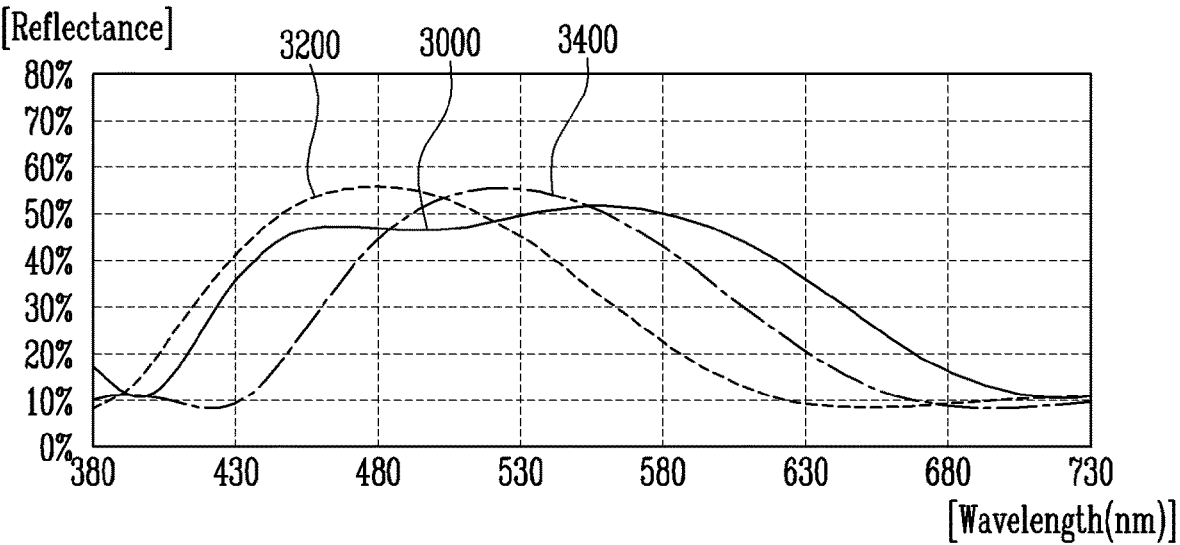
FIG. 8 illustrates a graph of reflectance of an insulating reflective layer according to one or more embodiments.

Referring to FIG. 8, a first graph 3200 showing reflectance of the first layer 120, a second graph 3400 showing reflectance of the second layer 140, and a combined graph 3000 showing reflectance of the insulating reflective layer 100 as a graph showing combined reflectance of the first layer 120 and the second layer 140 are shown.

For reference, the first graph 3200 is shown by a uniformly spaced dotted line, the second graph 3400 is shown by a single-dot chain line, and the combined graph 3400 is shown as a solid line.

According to one or more embodiments, the first graph 3200 may have a central wavelength (or peak wavelength) of about 480 nm. The second graph 3400 may have a central wavelength (or a peak wavelength) of about 520 nm. That is, according to one or more embodiments, referring to the first graph 3200, it can be determined that the second layer 140 is configured to reflect blue light, which is a wavelength band based on a central wavelength of about 480 nm. Referring to the second graph 3400, it can be determined that the second layer 120 is configured to reflect green light, which is a wavelength band based on a central wavelength of about 520 nm.

According to one or more embodiments, a wavelength range ($\Delta f_0$) of light configured to be reflected by each of the first layer 120 and the second layer 140 may be determined by Equation 1.

$$\Delta f_0 = f_0 \times \frac{4}{\pi} \arcsin\left(\frac{n_2 - n_1}{n_2 + n_1}\right) \qquad \text{Equation 1}$$

Here, $n_2$ is a refractive index of one of layers forming a pair, $n_1$ is a refractive index of the other one of the layers forming the pair, and $f_0$ is a central wavelength. For example, in equation 1 for determining the wavelength range ($\Delta f_0$) of the first layer 120, $n_1$ may be a refractive index of the (1_1)-th layer 1200a, and $n_2$ may be a refractive index of the (1_2)-th layer 1200b. In addition, in equation 1 for determining the wavelength range ($\Delta f_0$) of the second layer 140, $n_1$ may be a refractive index of the (2_1)-th layer 1400, and $n_1$ may be a refractive index of the second shared layer 1600b.

According to one or more embodiments, a value of ($n_2 - n_1$) is formed to be sufficiently large, so that a wavelength range ($\Delta f_0$) of light may be widely formed. For example, the first layer 120 may have a wide wavelength range based on a central wavelength of about 480 nm, and the second layer 140 may have a wide wavelength range based on a central wavelength of about 520 nm.

In addition, according to one or more embodiments, when referring to the combined graph 3000, the reflectance according to the light wavelength of the insulating reflective layer 100 is confirmed. That is, a reflective aspect of the insulating reflective layer 100 may be provided by combining reflective operations of the first layer 120 and the second layer 140. For example, an average wavelength of the insulating reflective layer 100 in which reflective performances of the first layer 120 and the second layer 140 is combined may be about 500 nm. However, the present disclosure is not necessarily limited to the example described above. Here, the average wavelength may represent an average value of the wavelength band of the light reflected by the insulating reflective layer 100.

According to one or more embodiments, as described above, it is possible to substantially prevent the peak regions of the center wavelength from being excessively separated from each other. Accordingly, according to the insulating reflective layer 100 according to one or more embodiments, dispersion according to the wavelength band of the reflective performance may be substantially prevented from occurring.

Next, a structure of the insulating reflective layer 100 according to a second embodiment will be described with reference to FIG. 9. Descriptions that may be redundant to those described above the above are simplified or are not repeated. FIG. 9 illustrates a schematic enlarged view of the area EA1 of FIG. 5, and illustrates a schematic cross-sectional view of a structure according to a second embodiment.

Referring to FIG. 9, the insulating reflective layer 100 according to the second embodiment is different from the insulating reflective layer 100 according to the first embodiment in that it further includes a low-refractive layer 240 on a distributed Bragg reflective layer 220.

For example, the insulating reflective layer 100 may include a distributed Bragg reflective layer 220 including a plurality of layers having different refractive indexes and a low-refractive layer 240 provided on the distributed Bragg reflective layer 220.

In this case, the low-refractive layer 240 may have a refractive index smaller than a refractive index of a layer adjacent to the low-refractive layer 240 as one layer of the distributed Bragg reflective layer 220. In addition, according to one or more embodiments, a refractive index of the low-refractive layer 240 may be greater than that of the color conversion layer CCL. For example, as one layer of the distributed Bragg reflective layer 220, a layer adjacent to the low-refractive layer 240 may include a silicon nitride (SiNx), and the low-refractive layer 240 may include a silicon oxide (SiOx) or a silicon oxynitride (SiOxNy). However, the present disclosure is not necessarily limited to the example described above.

According to one or more embodiments, the thickness of the low-refractive layer 240 may be determined based on the wavelength band of the light to be reflected by the distributed Bragg reflective layer 220 and the refractive index of the low-refractive layer 240. For example, the thickness of the low-refractive layer 240 may be determined by $f_0/4n$. Here, $f_0$ is a central wavelength of light to be reflected, and n is a refractive index of the low-refractive layer 240.

According to the present embodiment, the reflectance according to the light wavelength of the distributed Bragg reflective layer 220 may be further flattened. For example, the low-refractive layer 240 may be disposed to prevent having an excessive peak wavelength in a specific wavelength region, and accordingly, a deviation in reflectance according to a light wavelength band may be alleviated.

Next, an insulating reflective layer 100 according to a third embodiment will be described with reference to FIG. 10. Descriptions that may be redundant to those described above are simplified or are not repeated. FIG. 10 illustrates a schematic cross-sectional view of a sub-pixel according to a third embodiment. For better understanding and ease of description, in FIG. 10, detailed illustrations of configurations of the pixel circuit layer PCL are omitted, and descriptions thereof are comprehensively described as a lower layer 1000.

Referring to FIG. 10, the insulating reflective layer 100 according to the third embodiment is different from the insulating reflective layer 100 according to the first embodiment in that it is interposed between the passivation film PSV and the alignment electrode ELT.

According to one or more embodiments, the passivation film PSV, which is a via layer, may be disposed between the insulating reflective layer 100 and the substrate SUB. The insulating reflective layer 100 may be disposed on the passivation film PSV, which is a via layer. For example, one surface of the insulating reflective layer 100 may be in contact with the passivation film PSV. The other surface of the insulating reflective layer 100 may be in contact with the insulating pattern INP, the alignment electrode ELT, or the first insulating film INS1.

Next, an insulating reflective layer 100 according to a fourth embodiment will be described with reference to FIG. 11. Descriptions that may be redundant to those described above are simplified or are not repeated. FIG. 11 illustrates a schematic cross-sectional view of a sub-pixel according to a fourth embodiment. For better understanding and ease of description, in FIG. 11, detailed illustrations of configurations of the pixel circuit layer PCL are omitted, and descriptions thereof are comprehensively described as a lower layer 1000.

Referring to FIG. 11, the insulating reflective layer 100 according to the fourth embodiment is different from the insulating reflective layer 100 according to the first embodiment in that it is interposed between the passivation film PSV and the substrate SUB.

According to one or more embodiments, the insulating reflective layer 100 may be disposed between the substrate SUB and the passivation film PSV, which is a via layer. The insulating reflective layer 100 may be disposed on a rear surface of the passivation film PSV, which is a via layer. For example, one surface of the insulating reflective layer 100 may be in contact with the rear surface of the passivation film PSV, and the other surface of the insulating reflective layer 100 may be in contact with other components (for example, the second interlayer insulating film ILD2) of the pixel circuit layer PCL (or the lower layer 1000).

Next, other configurations of the pixel PXL including the color conversion layer CCL will be described with reference to FIG. 12 and FIG. 13.

Figure 12:
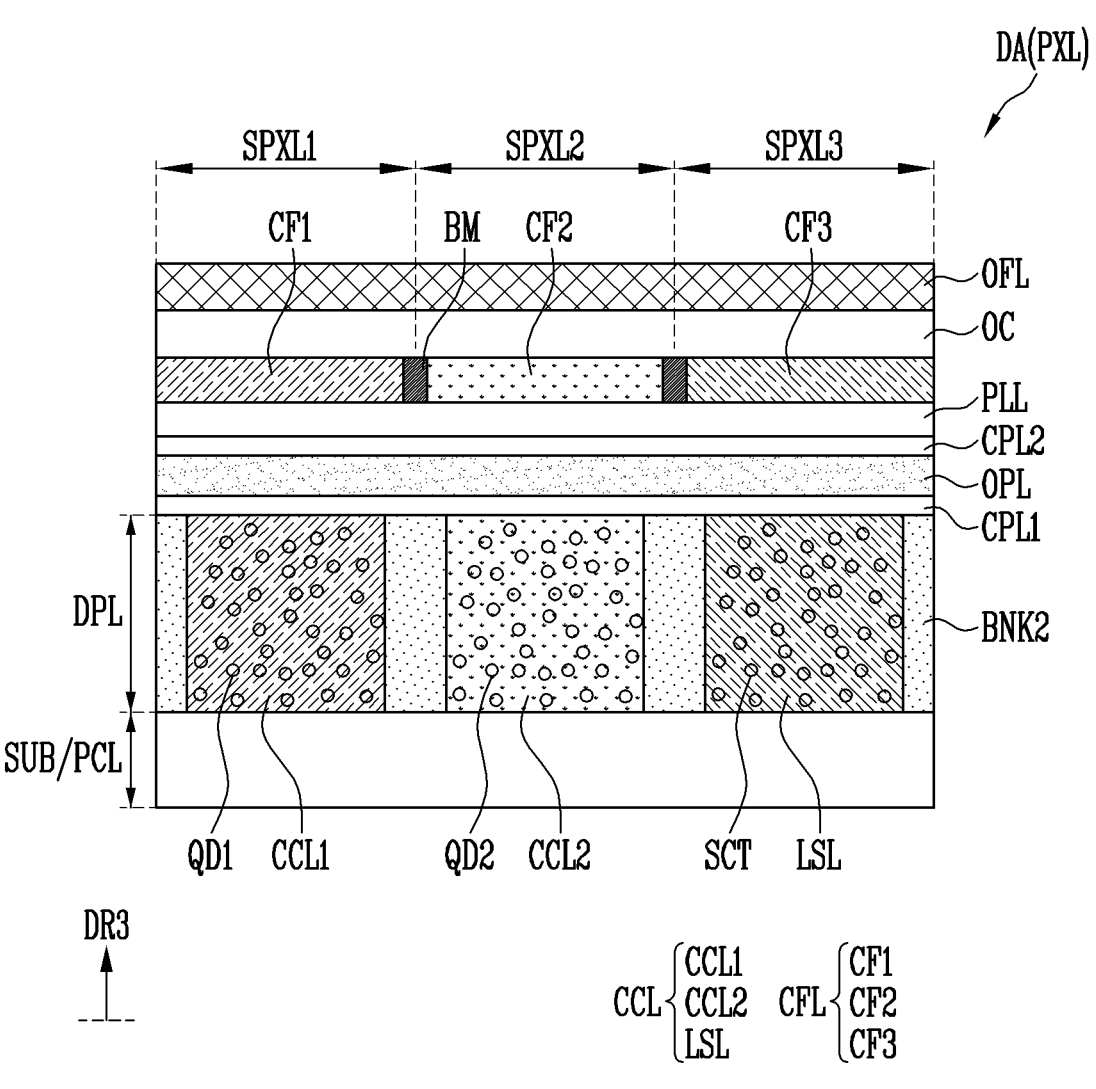
FIG. 12 illustrates a schematic cross-sectional view of first to third sub-pixels according to one or more embodiments.

FIG. 12 illustrates a schematic cross-sectional view of first to third sub-pixels according to one or more embodiments. FIG. 13 illustrates a schematic cross-sectional view of a sub-pixel according to one or more embodiments.

FIG. 12 illustrates the color conversion layer CCL, the optical layer OPL, and the color filter layer CFL. For better understanding and ease of description, in FIG. 12, from among the above-described configurations, configurations other than the second bank BNK2 from among the pixel circuit layer PCL and the display element layer DPL are omitted. FIG. 13 illustrates a stacked structure of a sub-pixel SPXL in relation to the color conversion layer CCL, the optical layer OPL, and the color filter layer CFL.

Figure 13:
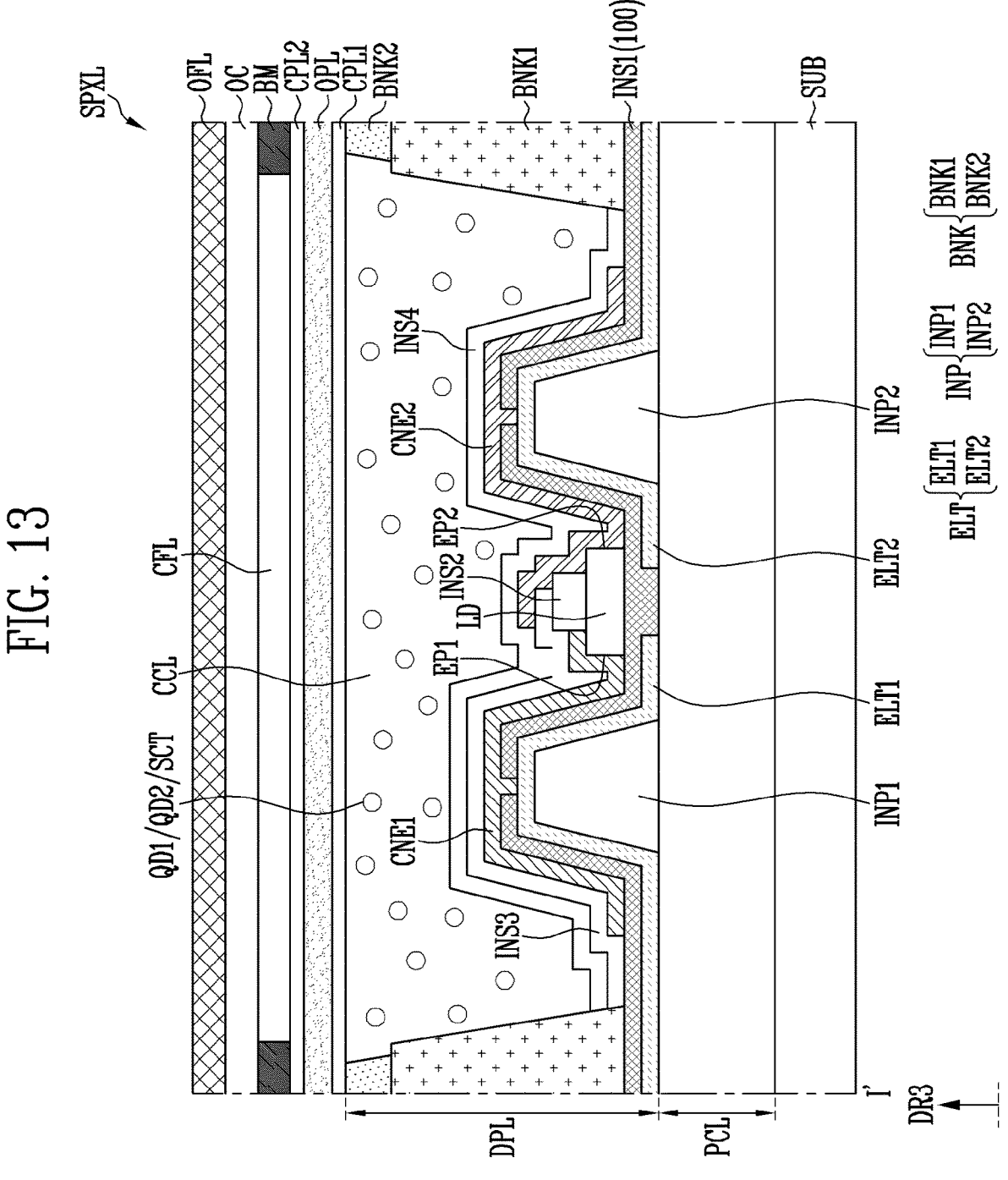
FIG. 13 illustrates a schematic cross-sectional view of a sub-pixel according to one or more embodiments.

Referring to FIG. 12 and FIG. 13, the second bank BNK2 is disposed between the first to third sub-pixels SPXL1, SPXL2, and SPXL3 or at a boundary therebetween, and may define a space (or an area) respectively overlapping the first to third sub-pixels SPXL1, SPXL2, and SPXL3. The space defined by the second bank BNK2 may be an area in which the color conversion layer CCL may be provided.

The color conversion layer CCL may be disposed on the light emitting elements LD in the space surrounded by the second bank BNK2. The color conversion layer CCL may include a first color conversion layer CCL1 disposed on the first sub-pixel SPXL1, a second color conversion layer CCL2 disposed on the second sub-pixel SPXL2, and a scattering layer LSL disposed on the third sub-pixel SPXL3.

The color conversion layer CCL may be disposed on the light emitting element LD. The color conversion layer CCL may be configured to change a wavelength of light. In one or more embodiments, the first to third sub-pixels SPXL1, SPXL2, and SPXL3 may include the light emitting elements LD that emit light of the same color. For example, the first to third sub-pixels SPXL1, SPXL2, and SPXL3 may include the light emitting elements LD that emit light of a third color (or blue color). The color conversion layer CCL including color converting particles is disposed on the first to third sub-pixels SPXL1, SPXL2, and SPXL3, respectively, thereby displaying a full-color image.

The first color conversion layer CCL1 may include first color converting particles that convert light of the third color emitted from the light emitting element LD into light of the first color. For example, the first color conversion layer CCL1 may include a plurality of first quantum dots QD1 dispersed in a matrix material (e.g., a predetermined matrix material) such as a base resin.

In one or more embodiments, when the light emitting element LD is a blue light emitting element that emits blue light and the first sub-pixel SPXL1 is a red pixel, the first color conversion layer CCL1 may include a first quantum dot QD1 that converts blue light emitted from the blue light emitting element into red light. The first quantum dot QD1 may absorb blue light to shift a wavelength according to an energy transition to emit red light. In one or more embodiments, when the first sub-pixel SPXL1 is a pixel of a different color, the first color conversion layer CCL1 may include a first quantum dot QD1 corresponding to a color of the first sub-pixel SPXL1.

The second color conversion layer CCL2 may include second color converting particles that convert light of the third color emitted from the light emitting element LD into light of the second color. For example, the second color conversion layer CCL2 may include a plurality of second quantum dots QD2 dispersed in a matrix material (e.g., a predetermined matrix material) such as a base resin.

In one or more embodiments, when the light emitting element LD is a blue light emitting element that emits blue light and the second sub-pixel SPXL2 is a green pixel, the second color conversion layer CCL2 may include a second quantum dot QD2 that converts blue light emitted from the blue light emitting element into green light. The second quantum dot QD2 may absorb blue light to shift a wavelength according to an energy transition to emit green light. In one or more embodiments, when the second sub-pixel SPXL2 is a pixel of a different color, the second color conversion layer CCL2 may include a second quantum dot QD2 corresponding to a color of the second sub-pixel SPXL2.

In one or more embodiments, blue light having a relatively short wavelength from among the visible ray bands is incident on the first quantum dot QD1 and the second quantum dot QD2, respectively, thereby increasing an absorption coefficient of the first quantum dot QD1 and the second quantum dot QD2. Accordingly, the efficiency of light emitted from the first sub-pixel SPXL1 and the second sub-pixel SPXL2 may be finally increased, and at the same time, the excellent color reproducibility may be secured. In addition, the light emitting unit EMU of the first to third sub-pixels SPXL1, SPXL2, and SPXL3 is configured by using the light emitting elements LD of the same color (for example, the blue color light emitting element), thereby increasing the manufacturing efficiency of the display device DD.

The scattering layer LSL may be provided to efficiently use the third color (or blue color) light emitted from the light emitting element LD. For example, when the light emitting element LD is a blue light emitting element that emits blue light and the third sub-pixel SPXL3 is a blue pixel, the scattering layer LSL may include at least one type of scatterer SCT to efficiently use the light emitted from the light emitting element LD. For example, the scatterer SCT of the scattering layer LSL may include at least one of a barium sulfate ($BaSO_4$), a calcium carbonate ($CaCO_3$), a titanium oxide $TiO_2$, a silicon oxide $SiO_2$, an aluminum oxide ($Al_2O_3$), a zirconium oxide $ZrO_2$, and a zinc oxide (ZnO). In one or more embodiments, the scatterer SCT is not disposed only in the third sub-pixel SPXL3, and may be selectively included in the first color conversion layer CCL1 or the second color conversion layer CCL2. In one or more embodiments, the scatterer SCT may be omitted to provide the scattering layer LSL made of a transparent polymer.

A first capping layer CPL1 may be disposed on the color conversion layer CCL. The first capping layer CPL1 may be entirely provided on the first to third sub-pixels SPXL1, SPXL2, and SPXL3. The first capping layer CPL1 may cover the color conversion layer CCL. The first capping layer CPL1 may prevent impurities such as moisture or air from penetrating from the outside to damage or contaminate the color conversion layer CCL.

The first capping layer CPL1 is an inorganic layer, which may include a silicon nitride (SiNx), an aluminum nitride (AlNx), a titanium nitride (TiNx), a silicon oxide (SiOx), an aluminum oxide (AlOx), a titanium oxide (TiOx), a silicon oxycarbide (SiOxCy), or a silicon oxynitride (SiOxNy).

The optical layer OPL may be disposed on the first capping layer CPL1. The optical layer OPL may serve to improve light extraction efficiency by recycling light provided from the color conversion layer CCL by total reflection. To this end, the optical layer OPL may have a relatively low refractive index compared to the color conversion layer CCL. For example, the refractive index of the color conversion layer CCL may be about 1.6 to 2.0, and the refractive index of the optical layer OPL may be about 1.1 to 1.3.

A second capping layer CPL2 may be disposed on the optical layer OPL. The second capping layer CPL2 may be entirely provided on the first to third sub-pixels SPXL1, SPXL2, and SPXL3. The second capping layer CPL2 may cover the optical layer OPL. The second capping layer CPL2 may prevent impurities such as moisture or air from penetrating from the outside to damage or contaminate the optical layer OPL.

The second capping layer CPL2 is an inorganic layer, which may include a silicon nitride (SiNx), an aluminum nitride (AlNx), a titanium nitride (TiNx), a silicon oxide (SiOx), an aluminum oxide (AlOx), a titanium oxide (TiOx), a silicon oxycarbide (SiOxCy), or a silicon oxynitride (SiOxNy).

A planarization layer PLL may be disposed on the second capping layer CPL2. The planarization layer PLL may be entirely provided on the first to third sub-pixels SPXL1, SPXL2, and SPXL3.

The planarization layer PLL may include an organic material such as an acrylic resin, an epoxy resin, a phenolic resin, a polyamide resin, a polyimide rein, a polyester resin, a polyphenylenesulfide resin, or a benzocyclobutene (BCB). However, it is not necessarily limited thereto, and the planarization layer PLL may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The color filter layer CFL may be disposed on the planarization layer PLL. The color filter layer CFL may include color filters CF1, CF2, and CF3 matching the color of each pixel PXL. A full-color image may be displayed by disposing the color filters CF1, CF2, and CF3 matching respective colors of the first to third sub-pixels SPXL1, SPXL2, and SPXL3.

The color filter layer CFL may include the first color filter CF1 that is disposed in the first sub-pixel SPXL1 to selectively transmit light emitted by the first sub-pixel SPXL1, the second color filter CF2 that is disposed in the second sub-pixel SPXL2 to selectively transmit light emitted by the second sub-pixel SPXL2, and the third color filter CF3 that is disposed in the third sub-pixel SPXL3 to selectively transmit light emitted by the third sub-pixel SPXL3.

In one or more embodiments, the first color filter CF1, the second color filter CF2, and the third color filter CF3 may be a red color filter, a green color filter, and a blue color filter respectively, but the present disclosure is not limited necessarily thereto. Hereinafter, when referring to one of the first color filter CF1, the second color filter CF2, and the third color filter CF3, or when comprehensively referring to two or more thereof, it will be referred to as the "color filter CF" or "color filters CF".

The first color filter CF1 may overlap the first color conversion layer CCL1 in the thickness direction (for example, the third direction DR3) of the substrate SUB. The first color filter CF1 may include a color filter material that selectively transmits light of a first color (or red color). For example, when the first sub-pixel SPXL1 is a red pixel, the first color filter CF1 may include a red color filter material.

The second color filter CF2 may overlap the second color conversion layer CCL2 in the thickness direction (for example, the third direction DR3) of the substrate SUB. The second color filter CF2 may include a color filter material that selectively transmits light of a second color (or green color). For example, when the second sub-pixel SPXL2 is a green pixel, the second color filter CF2 may include a green color filter material.

The third color filter CF3 may overlap the scattering layer LSL in the thickness direction (for example, the third direction DR3) of the substrate SUB. The third color filter CF3 may include a color filter material that selectively transmits light of a third color (or blue color). For example, when the third sub-pixel SPXL3 is a blue pixel, the third color filter CF3 may include a blue color filter material.

In one or more embodiments, a light blocking layer BM may be further disposed between the first to third color filters CF1, CF2, and CF3, and in this case, when the light blocking layer BM is formed between the first to third color filters CF1, CF2, and CF3, it is possible to prevent a color mixing defect viewed from a front or side of a display device DD. A material of the light blocking layer BM is not particularly limited, and may be made of various light blocking materials. For example, the light blocking layer BM may include a black matrix, or may be implemented by stacking the first to third color filters CF1, CF2, and CF3 on each other.

An overcoat layer OC may be disposed on the color filter layer CFL. The overcoat layer OC may be entirely provided on the first to third sub-pixels SPXL1, SPXL2, and SPXL3. The overcoat layer OC may cover the color filter layer CFL and a lower member thereof. The overcoat layer OC may prevent moisture or air from penetrating into the above-mentioned lower members that are disposed therebelow. In addition, the overcoat layer OC may protect the above-mentioned lower members from foreign matters such as dust.

The overcoat layer OC may include an organic material such as an acrylic resin, an epoxy resin, a phenolic resin, a polyamide resin, a polyimide rein, a polyester resin, a polyphenylenesulfide resin, or a benzocyclobutene (BCB). However, it is not necessarily limited thereto, and the overcoat layer OC may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The outer film layer OFL may be disposed on the overcoat layer OC. The outer film layer OFL may be disposed at an outer side of the display device DD to reduce external influence. The outer film layer OFL may be entirely provided on the first to third sub-pixels SPXL1, SPXL2, and SPXL3. In one or more embodiments, the outer film layer OFL may include one of a polyethyleneterephthalate (PET) film, a low reflective film, a polarization film, and a transmittance controllable film, but is not necessarily limited thereto. In one or more embodiments, the pixel PXL may include an upper substrate rather than the outer film layer OFL.

Figure 14:
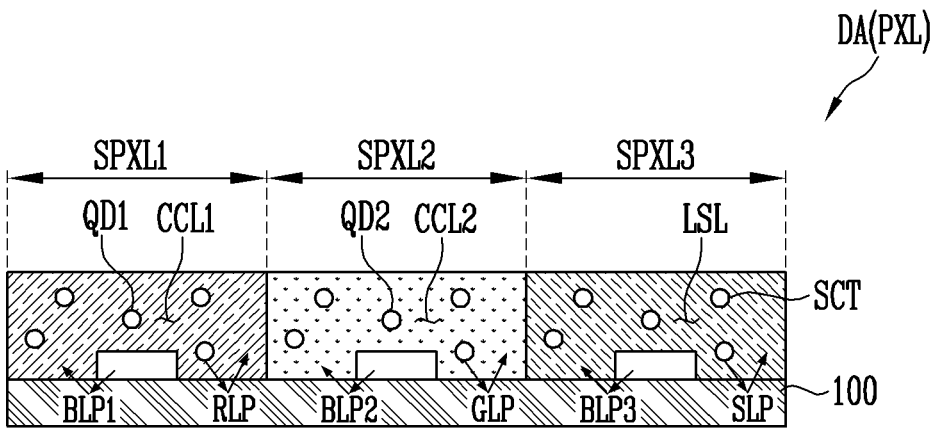
FIG. 14 illustrates a schematic cross-sectional view for explaining a light recycling structure of an insulating reflective layer according to one or more embodiments.

As described above, according to one or more embodiments, the insulating reflective layer 100 may be configured to reflect light of a wide wavelength band, so that it is possible to improve the light output efficiency of the display device DD (or the pixel PXL). In this regard, a technical effect of the structure according to one or more embodiments will be described in conjunction with FIG. 14. FIG. 14 illustrates a schematic cross-sectional view for explaining a light recycling structure of an insulating reflective layer according to one or more embodiments. For example, FIG. 14 illustrates a cross-sectional structure of the pixel PXL disposed in the display area DA, in which the first to third sub-pixels SPXL1, SPXL2, and SPXL3 are illustrated. One or more embodiments in which the light emitting element LD emits light of the same color in the first to third sub-pixels SPXL1, SPXL2, and SPXL3 will be mainly described with reference to FIG. 14.

According to one or more embodiments, in the first sub-pixel SPXL1, the insulating reflective layer 100 may recycle the light of the third color (for example, the light of the second wavelength band) provided from the light emitting element LD and the light of the first color provided from the first quantum dot QD1. For example, the light of the third color provided from the light emitting element LD in the first sub-pixel SPXL1 may be directed in a display direction (for example, the third direction DR3) of the display device DD through a first element light path BLP1. In addition, a portion of the light of the first color provided from the first quantum dot QD1 in the first sub-pixel SPXL1 may be directed in the display direction (for example, the third direction DR3) of the display device DD through a first quantum dot light path RLP.

According to one or more embodiments, in the second sub-pixel SPXL2, the insulating reflective layer 100 may recycle the light of the third color (for example, the light of the second wavelength band) provided from the light emitting element LD and the light of the second color (for example, the light of the first wavelength band) provided from the second quantum dot QD2. For example, the light of the third color provided from the light emitting element LD in the second sub-pixel SPXL2 may be directed in a display direction (for example, the third direction DR3) of the display device DD through a second element light path BLP2. In addition, the light of the second color provided from the second quantum dot QD2 in the second sub-pixel SPXL2 may be directed in the display direction (for example, the third direction DR3) of the display device DD through a second quantum dot light path GLP. In one or more embodiments, the number of the second sub-pixels SPXL2 in the display area DA may be greater than the number of the first sub-pixels SPXL1, and may be greater than the number of the third sub-pixels SPXL3. That is, in an area in which the second sub-pixel SPXL2 is disposed, the insulating reflective layer 100 may be configured to reflect the light emitted from the second sub-pixels SPXL2 included at a relatively large ratio.

According to one or more embodiments, in the third sub-pixel SPXL3, the insulating reflective layer 100 may recycle the light of the third color (for example, the light of the second wavelength band) provided from the light emitting element LD and the light of the third color provided from the scatterer SCT. For example, the light of the third color provided from the light emitting element LD in the third sub-pixel SPXL3 may be directed in a display direction (for example, the third direction DR3) of the display device DD through a third element light path BLP3. In addition, the light of the third color provided from the scatterer SCT in the third sub-pixel SPXL3 may be directed in a display direction (for example, the third direction DR3) of the display device DD through a scattering light path SLP. In one or more embodiments, the light emitting element LD may be disposed throughout the first to third sub-pixels SPXL1, SPXL2, and SPXL3, and may emit blue light that is substantially the same as the color of the light emitted by the third sub-pixel SPXL3. That is, the insulating reflective layer 100 may be configured to reflect the light emitted by the light emitting element LD disposed throughout the first to third sub-pixels SPXL1, SPXL2, and SPXL3.

As a result, according to one or more embodiments, the insulating reflective layer 100 entirely formed in the display area DA may optimally recycle light in the structures of the light emitting element LD, the color conversion layer CCL, and the scattering layer LSL.

While the present disclosure has been shown and described with reference to certain embodiments thereof, it will be understood by those skilled in the art that various changes in forms and details may be made therein without departing from the spirit and scope of the present disclosure as defined by the appended claims and their equivalents. Therefore, the technical scope of the present disclosure may be determined by the technical scope of the accompanying claims and their equivalents.

What is claimed is:

1. A display device comprising:
an insulating reflective layer on a substrate; and
a light emitting element on the insulating reflective layer,
wherein the insulating reflective layer comprises a first layer and a second layer on the first layer,
the first layer includes a first area of a shared layer that is at least a portion of the insulating reflective layer,
the second layer includes a second area of the shared layer,
the first layer comprises a first distributed Bragg reflector configured to reflect light in a first wavelength band, and
the second layer comprises a second distributed Bragg reflector configured to reflect light in a second wavelength band,
wherein a first central wavelength of the first wavelength band is different from a second central wavelength of the second wavelength band,
wherein the second central wavelength is smaller than the first central wavelength, and
wherein the first layer is closer to the substrate than the second layer.

2. The display device according to claim 1, wherein a difference between the first central wavelength and the second central wavelength is greater than or equal to 30 nm and less than or equal to 50 nm.

3. The display device according to claim 1, wherein:
a range of ±10 nm based on the first central wavelength includes 520 nm, and
a range of ±10 nm based on the second central wavelength includes 480 nm.

4. The display device according to claim 3, wherein an average wavelength of the insulating reflective layer is about 500 nm.

5. The display device according to claim 1, further comprising:
a first sub-pixel configured to emit light of a first color; a second sub-pixel configured to emit light of a second color; a third sub-pixel configured to emit light of a third color; and a color conversion layer on the light emitting element configured to change a wavelength of light,
wherein the insulating reflective layer is in the first sub-pixel, the second sub-pixel, and the third sub-pixel.

6. The display device according to claim 5, wherein:
the light emitting element is in each of the first sub-pixel, the second sub-pixel, and the third sub-pixel and is configured to emit light of the third color; and
the second wavelength band comprises at least a portion of a wavelength band corresponding to the third color.

7. The display device according to claim 5, wherein:
in a display area in which the first sub-pixel, the second sub-pixel, and the third sub-pixel are located, a number of second sub-pixels is larger than that of first sub-pixels and is larger than that of third sub-pixels; and
the first wavelength band comprises at least a portion of a wavelength band corresponding to the second color.

8. The display device according to claim 1, further comprising:
a via layer on the substrate,
wherein the via layer is between the insulating reflective layer and the substrate.

9. The display device according to claim 1, further comprising
a via layer on the substrate,
wherein the insulating reflective layer is between the substrate and the via layer.

10. A display device comprising:
an insulating reflective layer on a substrate; and
a light emitting element on the insulating reflective layer,
wherein the insulating reflective layer comprises a first layer and a second layer on the first layer,
the first layer includes a first area of a shared layer that is at least a portion of the insulating reflective layer,
the second layer includes a second area of the shared layer,
the first layer comprises a first distributed Bragg reflector configured to reflect light in a first wavelength band, and
the second layer comprises a second distributed Bragg reflector configured to reflect light in a second wavelength band, wherein:
the shared layer comprises a first shared layer in the first area and a second shared layer in the second area,
the first layer comprises a (1_1)-th layer, a (1_2)-th layer on the (1_1)-th layer, and the first shared layer on the (1_2)-th layer, and
the second layer comprises a (2_1)-th layer, and the second shared layer on the (2_1)-th layer.

11. The display device according to claim 10, wherein:
the (1_1)-th layer and the (1_2)-th layer form a pair, and the insulating reflective layer comprises a plurality of pairs of the layers.

12. The display device according to claim 10, wherein the first shared layer and the second shared layer comprise a same material.

13. The display device according to claim 10, wherein:

the (1_2)-th layer and the first shared layer form the first distributed Bragg reflector configured to reflect light in the first wavelength band, and the (2_1)-th layer and the second shared layer form the second distributed Bragg reflector configured to reflect light in the second wavelength band.

14. The display device according to claim 10, wherein the (1_1)-th layer, the first shared layer, and the second shared layer comprise a same material.

15. The display device according to claim 10, wherein the (1_2)-th layer and the (2_1)-th layer comprise a same material.

16. The display device according to claim 10, wherein:

the (1_1)-th layer, the first shared layer, and the second shared layer comprise a silicon oxide, and the (1_2)-th layer and the (2_1)-th layer comprise a silicon nitride.

17. The display device according to claim 10, wherein:

the (1_1)-th layer, the first shared layer, and the second shared layer comprise a silicon nitride, and the (1_2)-th layer and the (2_1)-th layer comprise a silicon oxide.

18. A display device comprising:

electrodes on a substrate;

an insulating reflective layer on the electrodes; and a light emitting element on the insulating reflective layer, wherein the insulating reflective layer comprises a Bragg distributed reflector layer and a low-refractive layer on the Bragg distributed reflector layer, and wherein a refractive index of the low-refractive layer is smaller than a refractive index of a layer of the Bragg distributed reflector layer adjacent to the low-refractive layer.

* * * * *